(12) United States Patent
Yamazaki

(10) Patent No.: US 10,797,179 B2
(45) Date of Patent: Oct. 6, 2020

(54) SEMICONDUCTOR DEVICE HAVING GATE ELECTRODE OVERLAPPING SEMICONDUCTOR FILM

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 290 days.

(21) Appl. No.: 15/614,694

(22) Filed: Jun. 6, 2017

(65) Prior Publication Data

US 2017/0271526 A1 Sep. 21, 2017

Related U.S. Application Data

(63) Continuation of application No. 14/391,024, filed as application No. PCT/JP2014/074155 on Sep. 5, 2014, now Pat. No. 9,680,026.

(30) Foreign Application Priority Data

Sep. 13, 2013 (JP) ................................. 2013-190275

(51) Int. Cl.
*H01L 29/786* (2006.01)
*H01L 29/417* (2006.01)
(Continued)

(52) U.S. Cl.
CPC .. *H01L 29/78648* (2013.01); *H01L 29/41733* (2013.01); *H01L 29/41791* (2013.01);
(Continued)

(58) Field of Classification Search
CPC ......... H01L 29/78648; H01L 29/78681; H01L 29/78696; H01L 29/785; H01L 29/41791; H01L 29/41733; G02F 1/1368
(Continued)

(56) References Cited

U.S. PATENT DOCUMENTS 5,807,772 A * 9/1998 Takemura ........... H01L 27/1214
438/157
6,011,277 A * 1/2000 Yamazaki ........... H01L 27/1214
257/66
(Continued)

FOREIGN PATENT DOCUMENTS

CN 001518771 A 8/2004
EP 0999595 A 5/2000
(Continued)

OTHER PUBLICATIONS

International Search Report (Application No. PCT/JP2014/074155) dated Dec. 16, 2014.
(Continued)

*Primary Examiner* — Daniel Whalen
(74) *Attorney, Agent, or Firm* — Fish & Richardson P.C.

(57) ABSTRACT

A semiconductor device that can operate at high speed or having high strength against stress is provided. One embodiment of the present invention is a semiconductor device including a semiconductor film including a channel formation region and a pair of impurity regions between which the channel formation region is positioned; a gate electrode overlapping side and top portions of the channel formation region with an insulating film positioned between the gate electrode and the side and top portions; and a source electrode and a drain electrode in contact with side and top portions of the pair of impurity regions.

19 Claims, 21 Drawing Sheets

(51) Int. Cl.
*H01L 29/78* (2006.01)
*G02F 1/1368* (2006.01)

(52) U.S. Cl.
CPC ...... *H01L 29/785* (2013.01); *H01L 29/78681* (2013.01); *H01L 29/78696* (2013.01); *G02F 1/1368* (2013.01)

(58) Field of Classification Search
USPC .......................................................... 257/66
See application file for complete search history.

(56) References Cited

U.S. PATENT DOCUMENTS

| | | | |
|---|---|---|---|
| 6,274,887 | B1 | 8/2001 | Yamazaki et al. |
| 6,628,349 | B1 | 9/2003 | Takei et al. |
| 6,642,085 | B1 | 11/2003 | Wolfe et al. |
| 6,777,716 | B1 | 8/2004 | Yamazaki et al. |
| 6,784,037 | B2 | 8/2004 | Yamazaki et al. |
| 6,847,050 | B2 | 1/2005 | Yamazaki et al. |
| 6,858,478 | B2 | 2/2005 | Chau et al. |
| 6,884,666 | B2 | 4/2005 | Takei et al. |
| 6,912,019 | B2 | 6/2005 | Yoshikawa |
| 6,914,295 | B2 | 7/2005 | Chau et al. |
| 6,972,467 | B2 | 12/2005 | Zhang et al. |
| 6,977,394 | B2 | 12/2005 | Yamazaki et al. |
| 7,005,366 | B2 | 2/2006 | Chau et al. |
| 7,166,863 | B2 | 1/2007 | Yamazaki et al. |
| 7,358,121 | B2 | 4/2008 | Chau et al. |
| 7,368,791 | B2 | 5/2008 | Zhang et al. |
| 7,394,446 | B2 | 7/2008 | Park |
| 7,417,253 | B2 | 8/2008 | Yamazaki et al. |
| 7,427,794 | B2 | 9/2008 | Chau et al. |
| 7,504,678 | B2 | 3/2009 | Chau et al. |
| 7,514,346 | B2 | 4/2009 | Chau et al. |
| 7,560,756 | B2 | 7/2009 | Chau et al. |
| 7,608,490 | B2 | 10/2009 | Yamazaki et al. |
| 7,611,932 | B2 | 11/2009 | Yin et al. |
| 7,723,721 | B2 | 5/2010 | Udagawa et al. |
| 7,863,622 | B2 | 1/2011 | Yamazaki et al. |
| 7,892,898 | B2 | 2/2011 | Oba |
| 8,023,042 | B2 | 9/2011 | Yamazaki et al. |
| 8,154,015 | B2 | 4/2012 | Udagawa et al. |
| 8,212,247 | B2 | 7/2012 | Kang et al. |
| 8,324,618 | B2 | 12/2012 | Udagawa et al. |
| 8,426,870 | B2 | 4/2013 | Kanegae et al. |
| 8,633,486 | B2 | 1/2014 | Yamamoto |
| 8,633,487 | B2 | 1/2014 | Yamamoto |
| 8,648,338 | B2 | 2/2014 | Udagawa et al. |
| 8,754,409 | B2 | 6/2014 | Yamazaki et al. |
| 8,896,777 | B2 | 11/2014 | Yamazaki et al. |
| 8,928,010 | B2 | 1/2015 | Yamazaki et al. |
| 8,994,887 | B2 | 3/2015 | Yamazaki et al. |
| 9,054,199 | B2 | 6/2015 | Udagawa et al. |
| 9,235,095 | B2 | 1/2016 | Yamazaki et al. |
| 9,577,016 | B2 | 2/2017 | Udagawa et al. |
| 9,905,624 | B2 | 2/2018 | Udagawa et al. |
| 2004/0036126 | A1 | 2/2004 | Chau et al. |
| 2004/0036127 | A1* | 2/2004 | Chau ..................... B82Y 10/00 257/401 |
| 2006/0166415 | A1 | 7/2006 | Afentakis et al. |
| 2009/0140270 | A1 | 6/2009 | Takahashi et al. |
| 2010/0140608 | A1* | 6/2010 | Park ..................... H01L 21/8221 257/43 |
| 2011/0193077 | A1* | 8/2011 | Yamazaki ......... H01L 21/02554 257/43 |
| 2011/0284852 | A1* | 11/2011 | Kim .................... H01L 27/1225 257/59 |
| 2012/0182208 | A1 | 7/2012 | Takahashi et al. |
| 2012/0241739 | A1 | 9/2012 | Yamazaki et al. |
| 2013/0069059 | A1 | 3/2013 | Yamazaki |
| 2013/0161606 | A1 | 6/2013 | Isobe et al. |
| 2013/0175530 | A1 | 7/2013 | Noda et al. |
| 2013/0181214 | A1 | 7/2013 | Yamazaki et al. |
| 2013/0277670 | A1 | 10/2013 | Isobe |
| 2013/0299821 | A1 | 11/2013 | Yamazaki |
| 2013/0309808 | A1 | 11/2013 | Zhang et al. |
| 2014/0001520 | A1* | 1/2014 | Glass ................ H01L 29/66439 257/288 |
| 2014/0151691 | A1 | 6/2014 | Matsubayashi et al. |
| 2014/0252353 | A1 | 9/2014 | Yamazaki et al. |
| 2018/0190745 | A1 | 7/2018 | Udagawa et al. |

FOREIGN PATENT DOCUMENTS

| | | |
|---|---|---|
| EP | 1310997 A | 5/2003 |
| EP | 2259314 A | 12/2010 |
| EP | 2278618 A | 1/2011 |
| JP | 06-005856 A | 1/1994 |
| JP | 2000-208777 A | 7/2000 |
| JP | 2000-299469 A | 10/2000 |
| JP | 2001-196594 A | 7/2001 |
| JP | 2003-208110 A | 7/2003 |
| JP | 2004-006712 A | 1/2004 |
| JP | 2005-196167 A | 7/2005 |
| JP | 2005-528810 | 9/2005 |
| JP | 2006-093715 A | 4/2006 |
| JP | 2007-013133 A | 1/2007 |
| JP | 2008-071922 A | 3/2008 |
| JP | 2009-151293 A | 7/2009 |
| JP | 2009-206306 A | 9/2009 |
| JP | 2011-023695 A | 2/2011 |
| JP | 2012-019120 A | 1/2012 |
| JP | 2012-064603 A | 3/2012 |
| JP | 2012-216802 A | 11/2012 |
| JP | 2013-137484 A | 7/2013 |
| JP | 2013-168642 A | 8/2013 |
| KR | 2005-0058457 A | 6/2005 |
| KR | 2012-0109396 A | 10/2012 |
| KR | 2014-0059772 A | 5/2014 |
| TW | I292954 | 1/2008 |
| TW | 201244103 | 11/2012 |
| WO | WO-2004/019414 | 3/2004 |
| WO | WO-2012/038999 | 3/2012 |

OTHER PUBLICATIONS

Written Opinion (Application No. PCT/JP2014/074155) dated Dec. 16, 2014.

* cited by examiner

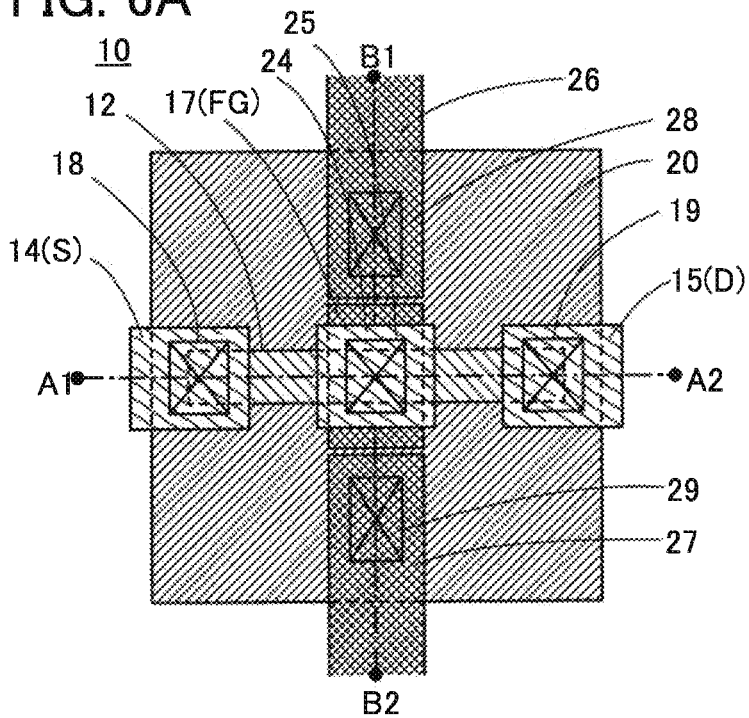
FIG. 6A
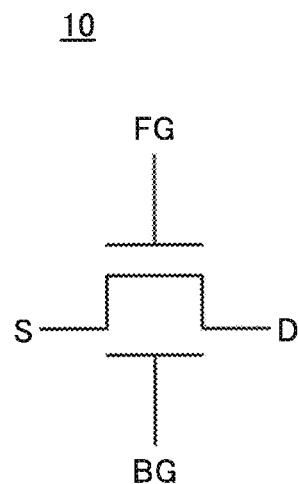
FIG. 6B
FIG. 6C
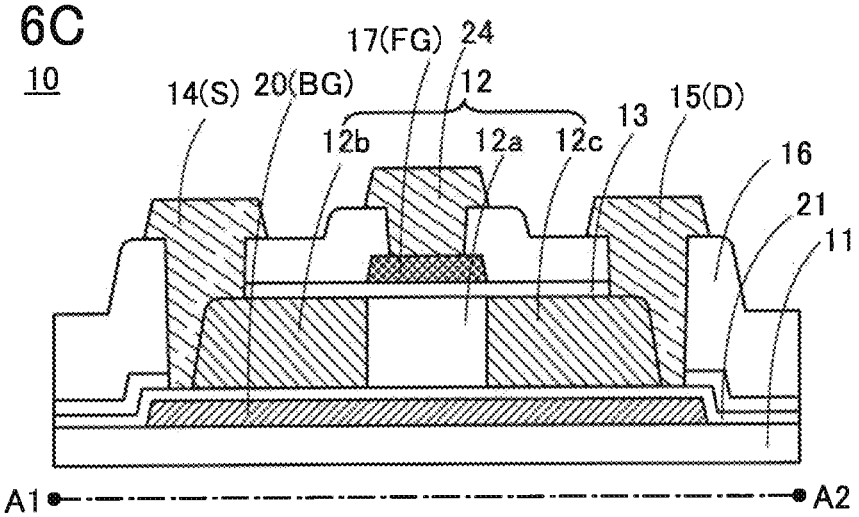
FIG. 6D
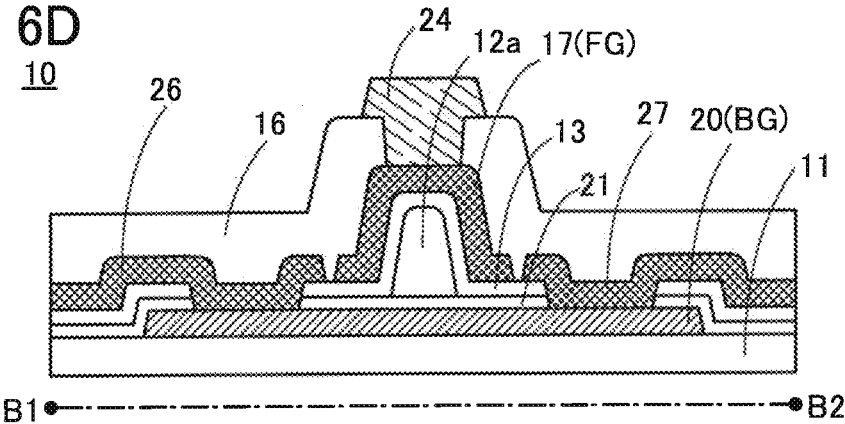

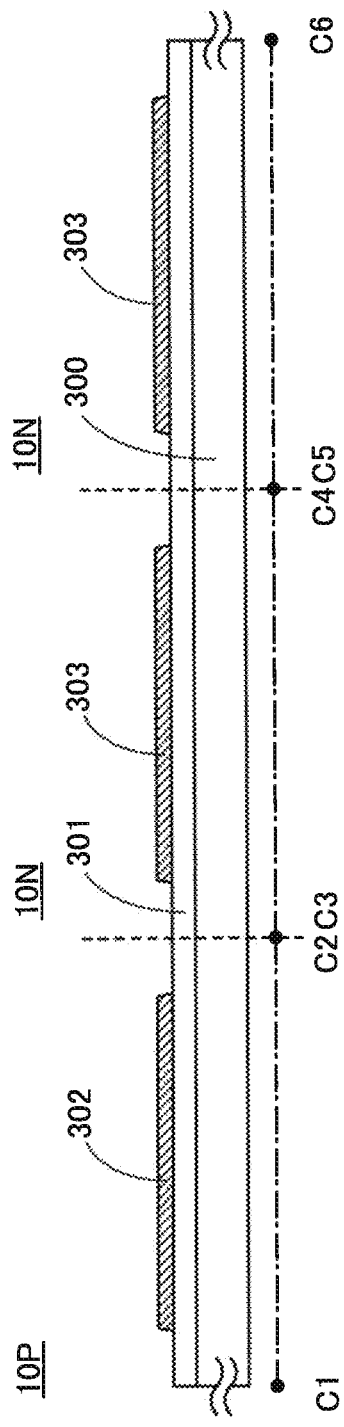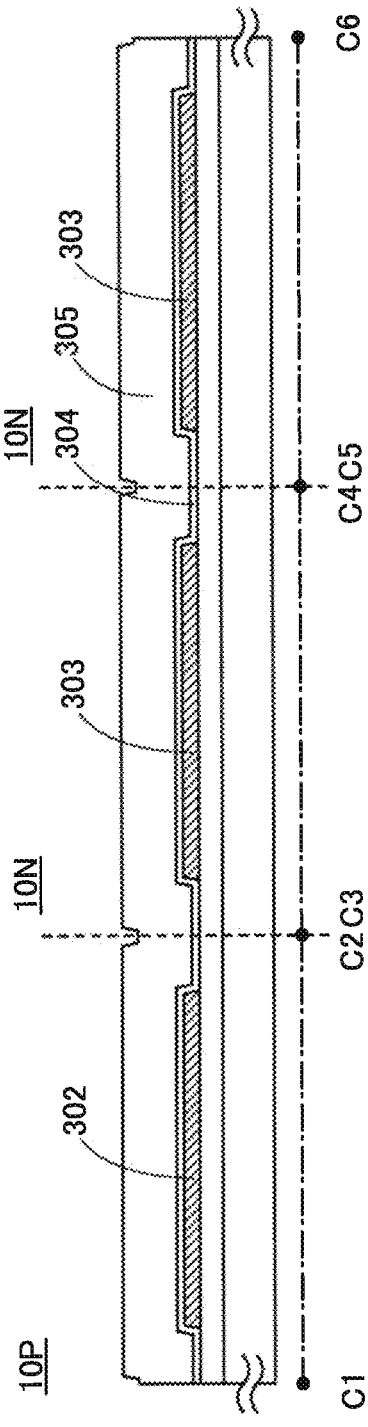

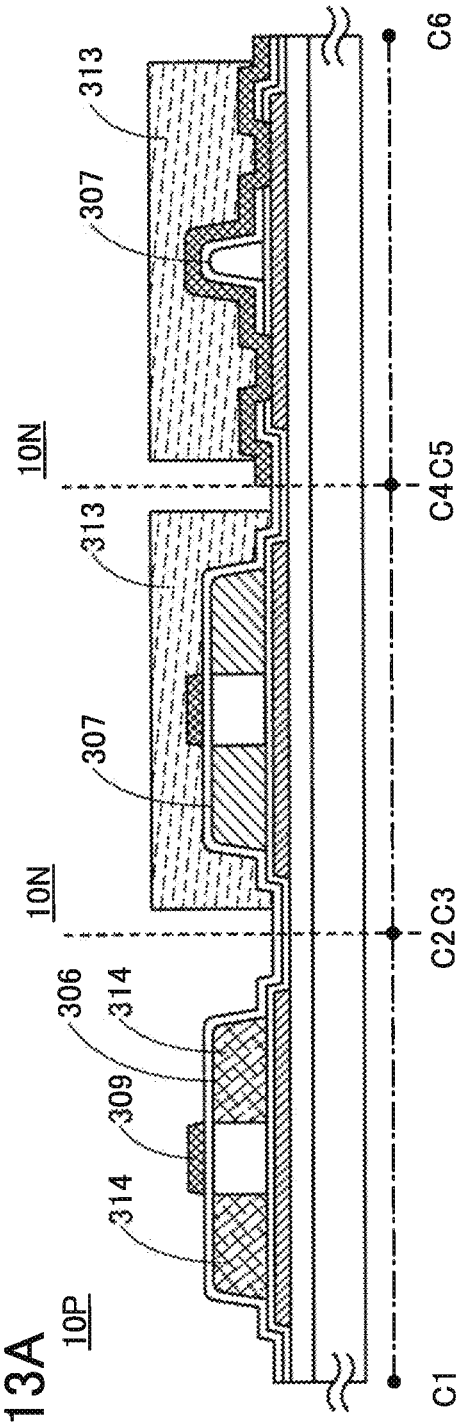
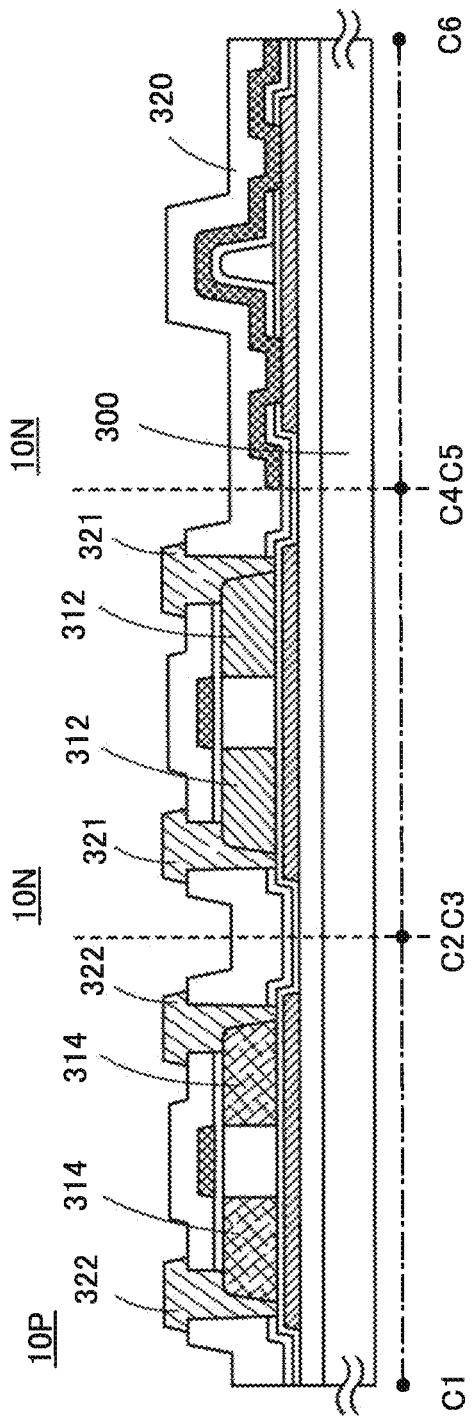
FIG. 13A
FIG. 13B

SEMICONDUCTOR DEVICE HAVING GATE ELECTRODE OVERLAPPING SEMICONDUCTOR FILM

CROSS-REFERENCE TO RELATED APPLICATIONS

This application is a continuation of U.S. application Ser. No. 14/391,024, filed Oct. 7, 2014, now allowed, which is a U.S. National Phase of International Patent Application No. PCT/JP2014/074155, filed Sep. 5, 2014, which claims the benefit of a foreign priority application filed in Japan as Serial No. 2013-190275 on Sep. 13, 2013, all of which are incorporated by reference.

TECHNICAL FIELD

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a memory device, a driving method thereof, or a manufacturing method thereof. Specifically, one embodiment of the present invention relates to a semiconductor device utilizing semiconductor characteristics.

BACKGROUND ART

Semiconductor display devices used in portable electronic appliances have been required to reduce an area other than a pixel portion (i.e., to narrow a bezel width). A system-on-panel obtained by forming a pixel portion and some of or all driver circuits over one substrate is one of effective means for achieving a narrow bezel width.

Patent Document 1 described below discloses a system-on-panel display device in which a display portion and peripheral circuits are formed on one substrate.

PATENT DOCUMENT

[Patent Document 1] Japanese Published Patent Application No. 2009-151293

DISCLOSURE OF INVENTION

Meanwhile, the number of pixels of an active-matrix semiconductor display device has been increased in order to display an image with higher definition and higher resolution. Therefore, higher speed operation is required for driver circuits such as a scan line driver circuit and a signal line driver circuit. In particular, a signal line driver circuit has even higher driving frequency than a scan line driver circuit because when pixels in a line are selected, an image signal needs to be supplied to all the pixels in the line.

Furthermore, use of a flexible material such as plastic for a substrate of a semiconductor device can widen the application range of the semiconductor device. In the case where a flexible substrate is used, high stress resistance is needed for a semiconductor element as compared to the case where a substrate that is poor in flexibility, such as a glass substrate, is used.

In view of the above technical background, an object of one embodiment of the present invention is to provide a semiconductor device that can operate at high speed. Another object of one embodiment of the present invention is to provide a semiconductor device having high strength against stress. An object of one embodiment of the present invention is to provide a novel semiconductor device. Note that the descriptions of these objects do not disturb the existence of other objects. In one embodiment of the present invention, there is no need to achieve all the objects. Other objects will be apparent from and can be derived from the description of the specification, the drawings, the claims, and the like.

A semiconductor device of one embodiment of the present invention includes a semiconductor film including a channel formation region and a pair of impurity regions between which the channel formation region is positioned; an insulating film covering side and top portions of the semiconductor film in the channel formation region; a gate electrode overlapping the side and top portions of the semiconductor film in the channel formation region with the insulating film positioned between the gate electrode and the side and top portions; and a source electrode and a drain electrode in contact with side and top portions of the semiconductor film in the pair of impurity regions.

A semiconductor device of one embodiment of the present invention includes a first gate electrode; a first insulating film covering the first gate electrode; a semiconductor film including a channel formation region overlapping the first gate electrode with the first insulating film positioned between the channel formation region and the first gate electrode, and a pair of impurity regions between which the channel formation region is positioned; a second insulating film covering side and top portions of the semiconductor film in the channel formation region; a second gate electrode overlapping the side and top portions of the semiconductor film with the second insulating film positioned between the second gate electrode and the side and top portions; and a source electrode and a drain electrode in contact with side and top portions of the semiconductor film in the pair of impurity regions.

A semiconductor device of one embodiment of the present invention includes a first gate electrode; a first insulating film covering the first gate electrode; a semiconductor film including a channel formation region overlapping the first gate electrode with the first insulating film positioned between the channel formation region and the first gate electrode, and a pair of impurity regions between which the channel formation region is positioned; a second insulating film covering side and top portions of the semiconductor film in the channel formation region; a second gate electrode overlapping the side and top portions of the semiconductor film with the second insulating film positioned between the second gate electrode and the side and top portions, and connected to the first gate electrode through an opening portion included in the first insulating film and the second insulating film; and a source electrode and a drain electrode in contact with side and top portions of the semiconductor film in the pair of impurity regions.

According to one embodiment of the present invention, a semiconductor device that can operate at high speed can be provided. According to one embodiment of the present invention, a semiconductor device having high strength against stress can be provided. According to one embodiment of the present invention, a novel semiconductor device, a novel display device, a novel light-emitting device, or the like can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

BRIEF DESCRIPTION OF DRAWINGS

FIGS. 6A to 6D illustrate a structure of a transistor.
FIGS. 10A and 10B illustrate a method for manufacturing a semiconductor device.
FIGS. 13A and 13B illustrate a method for manufacturing a semiconductor device.

BEST MODE FOR CARRYING OUT THE INVENTION

Figure 1A:
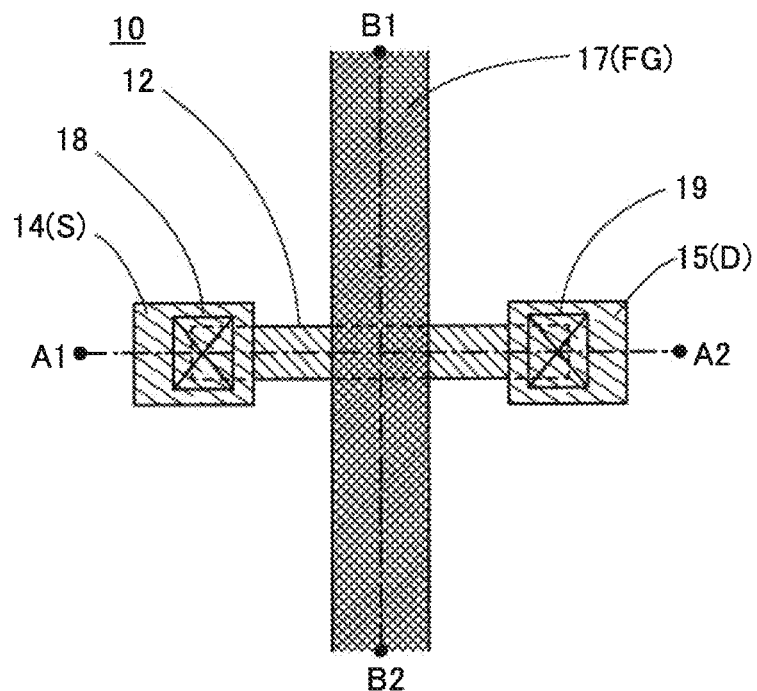
FIGS. 1A to 1D illustrate a structure of a transistor.

Embodiments of the present invention will be described below in detail with reference to the drawings. Note that the present invention is not limited to the following description. Note that the present invention is not limited to the following description, and it is easily understood by those skilled in the art that the mode and details can be variously changed without departing from the spirit and scope of the present invention. Therefore, the present invention should not be construed as being limited to the description of the embodiments below.

Note that one embodiment of the present invention includes, in its category, any semiconductor device using transistors, for example, integrated circuits, RF tags, and semiconductor display devices. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). In addition, the semiconductor display devices include, in its category, liquid crystal display devices, light-emitting devices in which a light-emitting element typified by an organic light-emitting element (OLED) is provided for each pixel, electronic papers, digital micromirror devices (DMDs), plasma display panels (PDPs), field emission displays (FEDs), and other semiconductor display devices in which a transistor is included in a driver circuit.

In this specification, the semiconductor display device includes, in its category, panels in which a display element such as a liquid crystal element or a light-emitting element is provided for each pixel, and modules in which an IC or the like including a controller is mounted on the panel. Furthermore, an element substrate corresponding to one mode before a display element is completed in a manufacturing process of a semiconductor display device falls into the category of the semiconductor display device of one embodiment of the present invention. In the element substrate, each of a plurality of pixels is provided with a transistor, electrodes used for a display element, such as a pixel electrode and a common electrode, and a capacitor.

In addition, the semiconductor display device of one embodiment of the present invention may include a touch panel which is a position input device capable of detecting a position pointed at with a finger, a stylus, or the like and generating a signal including the positional information.

Note that the term "connection" in this specification means electrical connection and corresponds to the case of a configuration in which current, voltage, or potential can be supplied or transmitted. Therefore, a configuration in which a circuit and another circuit are connected does not necessarily refers to a configuration in which they are directly connected, and also includes a configuration in which they are indirectly connected through an element such as a wiring, a resistor, a diode, or transistor so that current, voltage and potential can be supplied or transmitted. Furthermore, a configuration in which an element and another element are connected does not necessarily refers to a configuration in which they are directly connected, and also includes a configuration in which they are indirectly connected through an element such as a wiring, a resistor, diode, or a transistor so that current, voltage, or potential can be supplied to transmitted. In addition, even when different components are connected to each other in a circuit diagram, there is actually a case where one conductive film has functions of a plurality of components such as a case where part of a wiring serves as an electrode. The term "connection" in this specification also means such a case where one conductive film has functions of a plurality of components.

Note that a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. Furthermore, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Structure Example 1 of Transistor

Figure 1B:
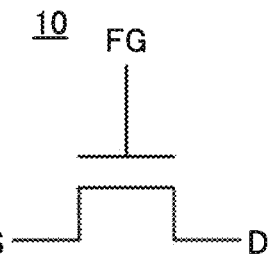
Figure 1C:
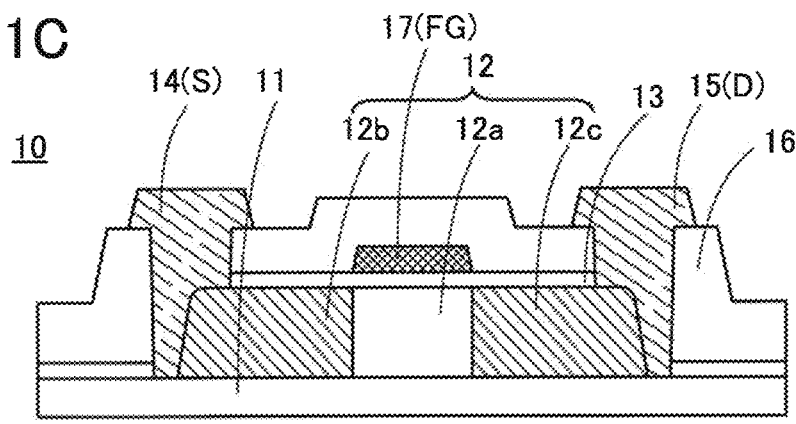
Figure 1D:
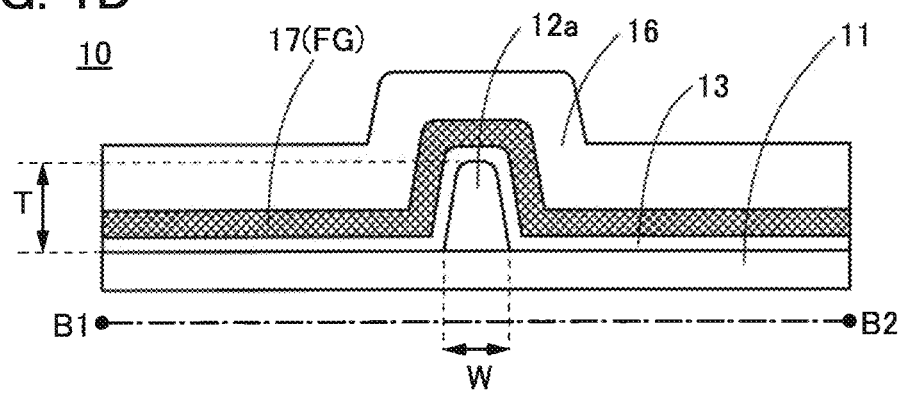

FIGS. 1A to 1D illustrate a structure example of a transistor 10 included in a semiconductor device of one embodiment of the present invention. FIG. 1A is a plan view of the transistor 10. Note that to clarify the layout of the transistor 10, a variety of insulating films are omitted in FIG. 1A. FIG. 1B shows a circuit symbol of the transistor 10 illustrated in FIG. 1A. FIG. 1C is a cross-sectional view taken along dashed line A1-A2 in the plan view in FIG. 1A. FIG. 1D is a cross-sectional view taken along dashed line B1-B2 in the plan view in FIG. 1A.

The transistor 10 illustrated in FIGS. 1A, 1C, and 1D includes a semiconductor film 12 over a substrate 11 having an insulating surface. The semiconductor film 12 includes a channel formation region 12a and impurity regions 12b and 12c between which the channel formation region 12a is positioned. Furthermore, the transistor 10 includes an insulating film 13 that functions as a gate insulating film and covers side and top portions of the semiconductor film 12 in the channel formation region 12a. In addition, the transistor 10 includes a conductive film 17 that functions as a gate electrode (FG) denoted by a circuit symbol in FIG. 1B, and overlaps side and top portions of the semiconductor film 12 in the channel formation region 12a with the insulating film 13 positioned therebetween. Moreover, the transistor 10 includes conductive films 14 and 15 that function as a source electrode (S) and a drain electrode (D) denoted by circuit symbols in FIG. 1B, and are connected to side and top portions of the semiconductor film 12 in the impurity regions 12b and 12c.

Note that at least part (or all) of the conductive film 14 (and/or the conductive film 15) is provided on at least part (or all) of a surface, a side surface, a top surface, and/or a bottom surface of the semiconductor film 12.

Alternatively, at least part (or all) of the conductive film 14 (and/or the conductive film 15) is in contact with at least part (or all) of the surface, the side surface, the top surface, and/or the bottom surface of the semiconductor film 12. Alternatively, at least part (or all) of the conductive film 14 (and/or the conductive film 15) is in contact with at least part (or all) of the semiconductor film 12.

Alternatively, at least part (or all) of the conductive film 14 (and/or the conductive film 15) is electrically connected to at least part (or all) of the surface, the side surface, the top surface, and/or the bottom surface of the semiconductor film 12. Alternatively, at least part (or all) of the conductive film 14 (and/or the conductive film 15) is electrically connected to at least part (or all) of the semiconductor film 12.

Alternatively, at least part (or all) of the conductive film 14 (and/or the conductive film 15) is provided near at least part (or all) of the surface, the side surface, the top surface, and/or the bottom surface of the semiconductor film 12. Alternatively, at least part (or all) of the conductive film 14 (and/or the conductive film 15) is provided near at least part (or all) of the semiconductor film 12.

Alternatively, at least part (or all) of the conductive film 14 (and/or the conductive film 15) is provided on a side of at least part (or all) of the surface, the side surface, the top surface, and/or the bottom surface of the semiconductor film 12. Alternatively, at least part (or all) of the conductive film 14 (and/or the conductive film 15) is provided on a side of at least part (or all) of the semiconductor film 12.

Alternatively, at least part (or all) of the conductive film 14 (and/or the conductive film 15) is provided obliquely above at least part (or all) of the surface, the side surface, the top surface, and/or the bottom surface of the semiconductor film 12. Alternatively, at least part (or all) of the conductive film 14 (and/or the conductive film 15) is provided obliquely above at least part (or all) of the semiconductor film 12.

Alternatively, at least part (or all) of the conductive film 14 (and/or the conductive film 15) is provided above at least part (or all) of the surface, the side surface, the top surface, and/or the bottom surface of the semiconductor film 12. Alternatively, at least part (or all) of the conductive film 14 (and/or the conductive film 15) is provided above at least part (or all) of the semiconductor film 12.

FIGS. 1A, 1C, and 1D illustrate an example in which an insulating film 16 is provided over the semiconductor film 12, the insulating film 13, and the conductive film 17, and the conductive films 14 and 15 are provided over the insulating film 16. Furthermore, in FIGS. 1A, 1C, and 1D, the conductive films 14 and 15 are connected to the impurity regions 12b and 12c through opening portions 18 and 19 of the insulating film 16, respectively.

As illustrated in FIGS. 1A to 1D, in the transistor 10 of one embodiment of the present invention, the side and top portions of the semiconductor film 12 in the channel formation region 12a and the conductive film 17 overlap each other, whereby carriers flow in a wide range including the side and top portions of the channel formation region 12a. Therefore, an area on the substrate occupied by the channel formation region 12a of the semiconductor film 12 can be reduced and the amount of carriers transferred in the transistor 10 can be increased. As a result, the on-state current of the transistor 10 is increased and the field-effect mobility of the transistor 10 is also increased. On the assumption that the length of the semiconductor film 12 in the channel formation region 12a in the channel width direction (the channel width) is W, and the thickness of the semiconductor film 12 in the channel formation region 12a is T, when the aspect ratio that corresponds to the ratio of the thickness T to the channel width W is high, a region where carrier flows becomes wider. Thus, the on-state current of the transistor 10 is further increased and the field-effect mobility of the transistor 10 is further increased. Note that in this specification, the aspect ratio refers to the ratio (T/W) of the thickness (T) of a semiconductor film to the length of a short side of a bottom surface (channel width W) of the semiconductor layer.

Unlike in the case of a transistor using a bulk semiconductor substrate, in the case of the transistor 10 using the semiconductor film 12 that is a thin film, the aspect ratio is preferably such that the high crystallinity of the semiconductor film 12 can be ensured. In the case where the semiconductor film 12 contains silicon or the case where the semiconductor film 12 contains silicon and germanium, in consideration of ensuring the high crystallinity of the semiconductor film 12, specifically, the thickness T is preferably greater than or equal to 5 nm and less than or equal to 150 nm, and further preferably greater than or equal to 20 nm and less than or equal to 100 nm. On the assumption that the thickness T falls within the above range, in consideration of the resolution of an exposure apparatus which is approximately several micrometers in the case of using a glass substrate, the specific aspect ratio is preferably greater than or equal to 0.05 and less than or equal to 10, and further preferably greater than or equal to 0.1 and less than or equal to 5, and still further preferably greater than or equal to 1 and less than or equal to 5.

The channel length direction refers to a direction in which carriers are transferred at the shortest distance between the impurity regions 12b and 12c. The channel width direction refers to a direction perpendicular to the channel length direction.

Furthermore, as illustrated in FIGS. 1A to 1D, in the transistor 10 of one embodiment of the present invention, the conductive films 14 and 15 are connected to the side and top portions of the semiconductor film 12 in the impurity regions 12b and 12c, respectively. Therefore, as compared to the case where the conductive films 14 and 15 are connected to only the top portion of the semiconductor film 12, areas where the conductive films 14 and 15 are respectively in contact with the impurity regions 12b and 12c can be large. Accordingly, contact resistance between the conductive films 14 and 15 and the impurity regions 12b and 12c can be reduced; as a result, the on-state current of the transistor 10 can be increased.

Structure Example 2 of Transistor

Figure 2A:
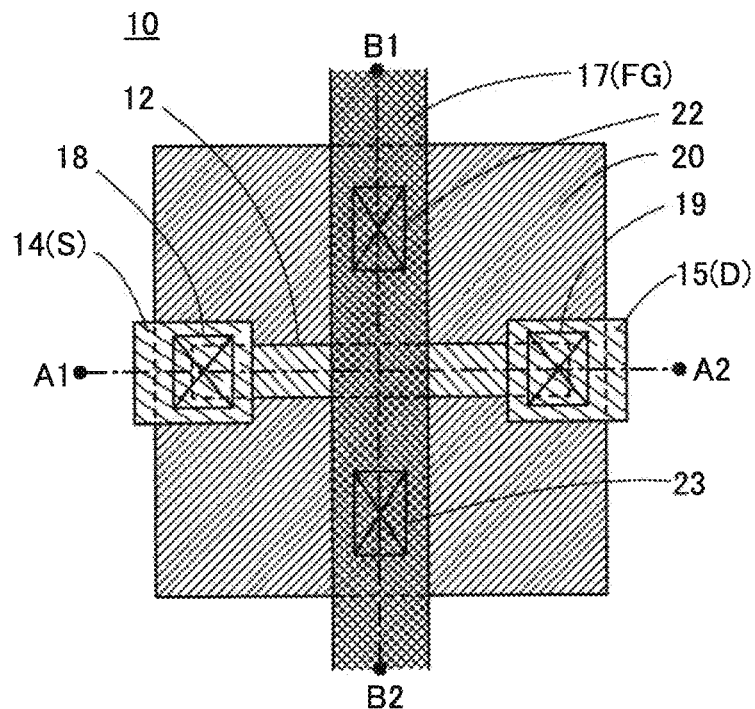
FIGS. 2A to 2D illustrate a structure of a transistor.
Figure 2B:
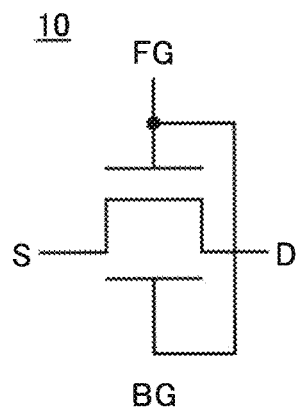
Figure 2C:
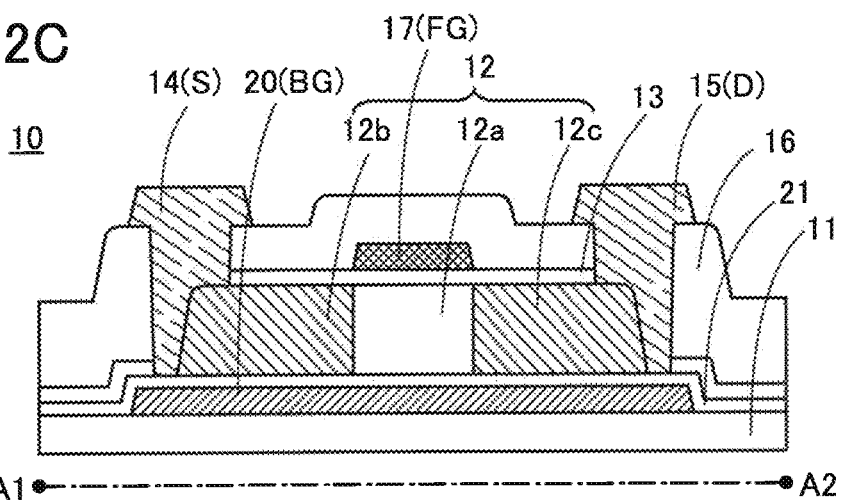
Figure 2D:
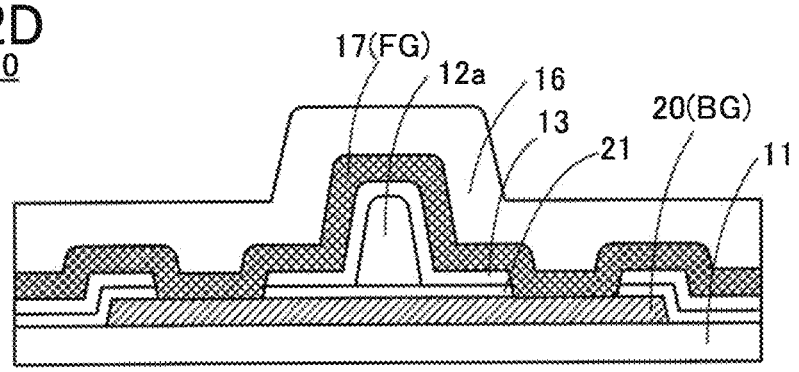

Next, FIGS. 2A to 2D illustrate a structure example of a transistor 10 included in a semiconductor device of one embodiment of the present invention, which is different from the structure example in FIGS. 1A to 1D. FIG. 2A is a plan view of the transistor 10. Note that to clarify the layout of the transistor 10, a variety of insulating films are omitted in FIG. 2A. FIG. 2B shows a circuit symbol of the transistor 10 illustrated in FIG. 2A. FIG. 2C is a cross-sectional view taken along dashed line A1-A2 in the plan view in FIG. 2A. FIG. 2D is a cross-sectional view taken along dashed line B1-B2 in the plan view in FIG. 2A.

The transistor 10 illustrated in FIGS. 2A, 2C, and 2D includes a conductive film 20 that functions as a gate electrode (BG) denoted by a circuit symbol in FIG. 2B, over the substrate 11 having an insulating surface. Furthermore, the transistor 10 includes an insulating film 21 that functions as a gate insulating film and covers the conductive film 20. Moreover, the transistor 10 includes the semiconductor film 12 overlapping the conductive film 20 with the insulating film 21 positioned therebetween. The semiconductor film 12 includes the channel formation region 12a and the impurity regions 12b and 12c between which the channel formation region 12a is positioned. Furthermore, the transistor 10 includes the insulating film 13 that functions as a gate insulating film and covers side and top portions of the semiconductor film 12 in the channel formation region 12a. In addition, the transistor 10 includes the conductive film 17 that functions as a gate electrode (FG) denoted by a circuit symbol in FIG. 2B, and overlaps side and top portions of the semiconductor film 12 in the channel formation region 12a with the insulating film 13 positioned therebetween. The conductive film 17 is connected to the conductive film 20 through opening portions 22 and 23 of the insulating film 13 and the insulating film 21. Moreover, the transistor 10 includes the conductive films 14 and 15 that function as a source electrode (S) and a drain electrode (D) denoted by circuit symbols in FIG. 2B, and are connected to side and top portions of the semiconductor film 12 in the impurity regions 12b and 12c.

FIGS. 2A, 2C, and 2D illustrate an example in which the insulating film 16 is provided over the semiconductor film 12, the insulating film 13, and the conductive film 17, and the conductive films 14 and 15 are provided over the insulating film 16. Furthermore, in FIGS. 2A, 2C, and 2D, the conductive films 14 and 15 are connected to the impurity regions 12b and 12c through the opening portions 18 and 19 of the insulating film 16, respectively.

FIGS. 2A, 2C, and 2D illustrate an example in which the opening portion 22 and the opening portion 23 face each other with the semiconductor film 12 positioned therebetween.

As illustrated in FIGS. 2A to 2D, in the transistor 10 of one embodiment of the present invention, the side and top portions of the semiconductor film 12 in the channel formation region 12a and the conductive film 17 overlap each other, whereby carriers flow in a wide range including the side and top portions of the channel formation region 12a. Therefore, an area on the substrate occupied by the channel formation region 12a of the semiconductor film 12 can be reduced and the amount of carriers transferred in the transistor 10 can be increased. As a result, the on-state current of the transistor 10 is increased and the field-effect mobility of the transistor 10 is also increased. On the assumption that the length of the semiconductor film 12 in the channel formation region 12a in the channel width direction (the channel width) is W, and the thickness of the semiconductor film 12 in the channel formation region 12a is T, when the aspect ratio that corresponds to the ratio of the thickness T to the channel width W is high, a region where carrier flows becomes wider. Thus, the on-state current of the transistor 10 is further increased and the field-effect mobility of the transistor 10 is further increased.

As described above, in the case of the transistor 10 using the semiconductor film 12 that is a thin film, the aspect ratio is preferably such that the high crystallinity of the semiconductor film 12 can be ensured. In the case where the semiconductor film 12 contains silicon or the case where the semiconductor film 12 contains silicon and germanium, in consideration of ensuring the high crystallinity of the semiconductor film 12, specifically, the thickness T is preferably greater than or equal to 5 nm and less than or equal to 150 nm, and further preferably greater than or equal to 20 nm and less than or equal to 100 nm. On the assumption that the thickness T falls within the above range, in consideration of the resolution of an exposure apparatus which is approximately several micrometers in the case of using a glass substrate, the specific aspect ratio is preferably greater than or equal to 0.05 and less than or equal to 10, and further preferably greater than or equal to 0.1 and less than or equal to 5, and still further preferably greater than or equal to 1 and less than or equal to 5.

Furthermore, as illustrated in FIGS. 2A to 2D, in the transistor 10 of one embodiment of the present invention, the conductive films 14 and 15 are connected to the side and top portions of the semiconductor film 12 in the impurity regions 12b and 12c, respectively.

Therefore, as compared to the case where the conductive films 14 and 15 are connected to only the top portion of the semiconductor film 12, areas where the conductive films 14 and 15 are respectively in contact with the impurity regions 12b and 12c can be large. Accordingly, contact resistance between the conductive films 14 and 15 and the impurity regions 12b and 12c can be reduced; as a result, the on-state current of the transistor 10 can be increased.

In the transistor 10 illustrated in FIGS. 2A to 2D, the conductive film 20 functioning as a gate electrode (BG) is provided in the vicinity of a surface of the semiconductor film 12 (on a back channel region side) which is far from the conductive film 17 functioning as a gate electrode (FG). The conductive film 20 is connected to the conductive film 17. The above structure can prevent generation of fixed charge in the back channel region in the transistor 10 in FIGS. 2A to 2D, which can reduce the off-state current. Furthermore, in the transistor 10 in FIGS. 2A to 2D, since the conductive film 20 is connected to the conductive film 17, the on-state current can be increased as compared to that in the transistor 10 in FIGS. 1A to 1D because a region in which carriers move extends over a large area.

Moreover, in the transistor 10 in FIGS. 2A to 2D, the conductive film 20 is provided below the semiconductor film 12 so as to be positioned below a channel formation region 12a, and the conductive film 17 is provided over the semiconductor film 12 so as to overlap the channel formation region 12a. Therefore, the semiconductor film 12 is supported from above and below by the conductive film 17 and the conductive film 20; thus, the transistor 10 can have high strength against stress as compared to the transistor 10 in FIGS. 1A to 1D.

Structure Example 3 of Transistor

FIGS. 1 to 1D and FIGS. 2A to 2D illustrate an example of the transistor 10 in which the conductive film 14 and the conductive film 15 functioning as a source electrode and a drain electrode are provided over the insulating film 16, and the conductive film 14 and the conductive film 15 are respectively connected to the impurity region 12b and the impurity region 12c through the opening portions of the insulating film 16. The insulating film 16 may be provided over the conductive film 14 and the conductive film 15 in the transistor 10 of one embodiment of the present invention.

Figure 3A:
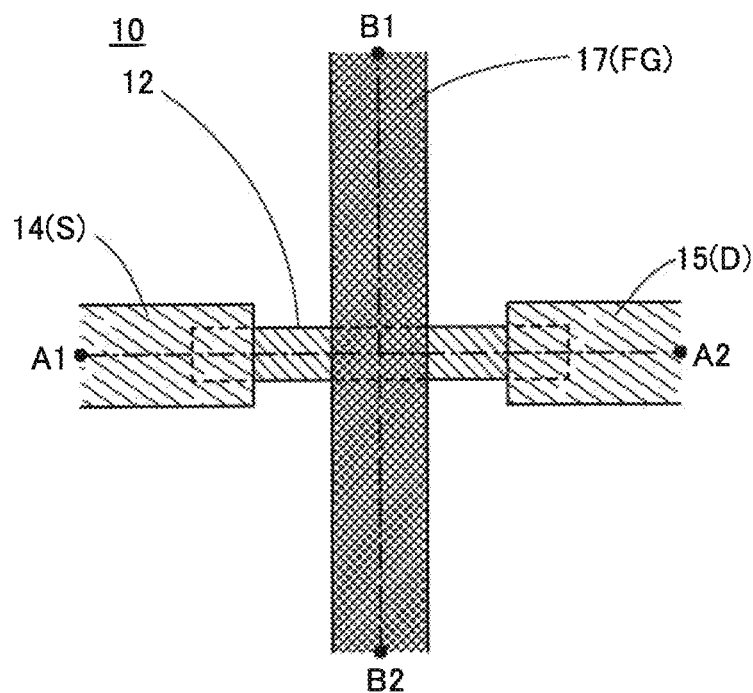
FIGS. 3A to 3D illustrate a structure of a transistor.
Figure 3B:
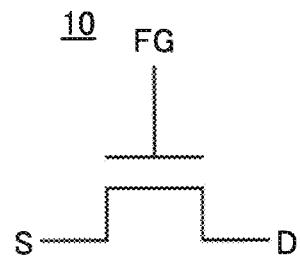
Figure 3C:
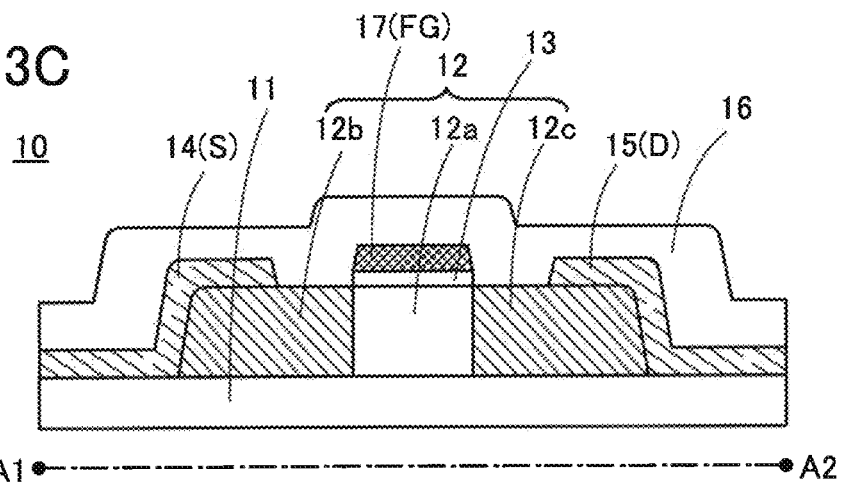
Figure 3D:
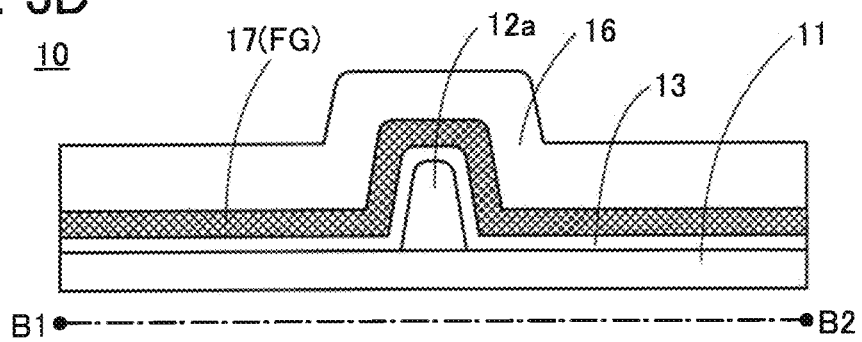

The structure of the transistor 10 illustrated in FIGS. 3A to 3D is different from that of the transistor 10 in FIGS. 1A to 1D in that the insulating film 16 is provided over the conductive film 14 and the conductive film 15. FIG. 3A is a plan view of the transistor 10. Note that to clarify the layout of the transistor 10, a variety of insulating films are omitted in FIG. 3A. FIG. 3B shows a circuit symbol of the transistor 10 illustrated in FIG. 3A. FIG. 3C is a cross-sectional view taken along dashed line A1-A2 in the plan view in FIG. 3A. FIG. 3D is a cross-sectional view taken along dashed line B1-B2 in the plan view in FIG. 3A.

The transistor 10 illustrated in FIGS. 3A, 3C, and 3D includes the conductive film 14 and the conductive film 15 that function as a source electrode (S) and a drain electrode (D) denoted by circuit symbols in FIG. 3B and are connected to side and top portions of the semiconductor film 12 in the impurity region 12b and the impurity region 12c. In FIGS. 3A, 3C, and 3D, the insulating film 16 is provided over the semiconductor film 12, the insulating film 13, the conductive film 17, the conductive film 14, and the conductive film 15.

Figure 4A:
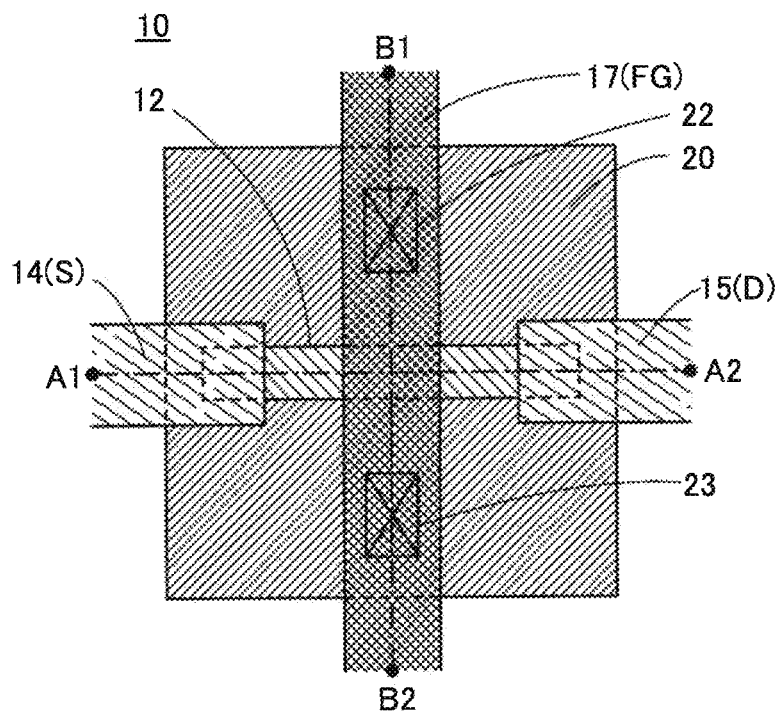
FIGS. 4A to 4D illustrate a structure of a transistor.
Figure 4B:
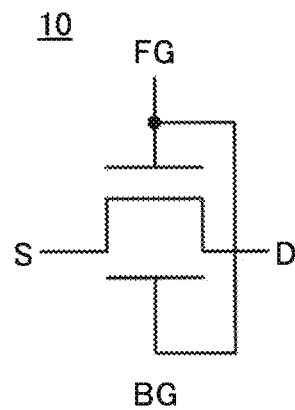
Figure 4C:
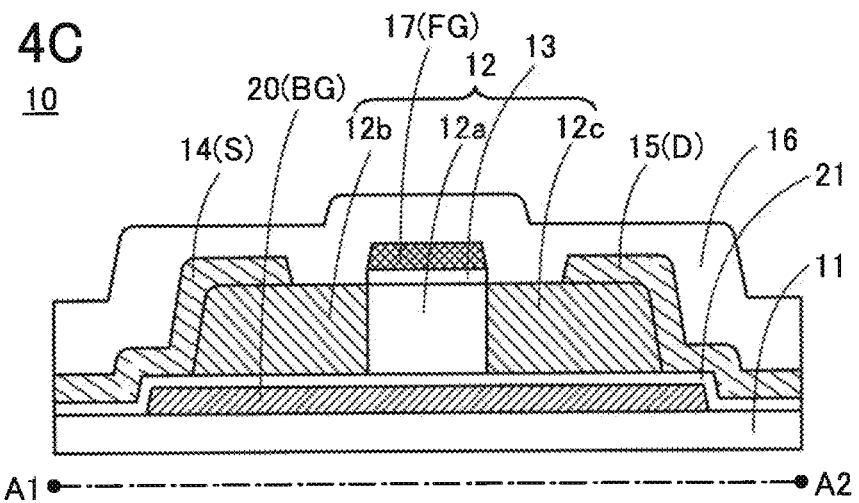
Figure 4D:
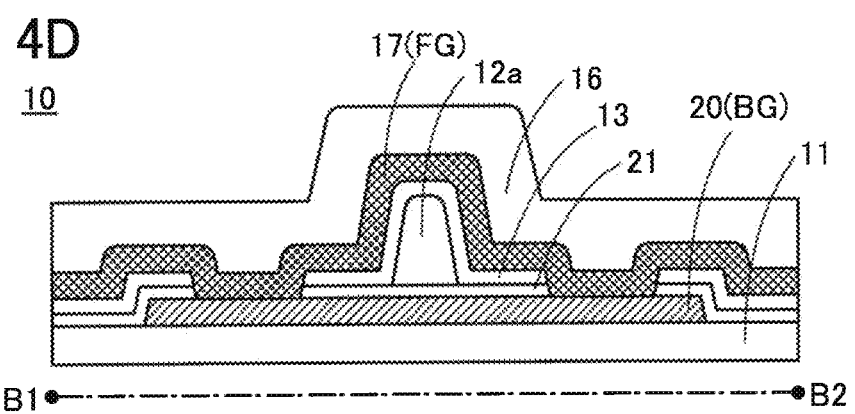

The structure of the transistor 10 in FIGS. 4A to 4D is different from that of the transistor 10 in FIGS. 2A to 2D in that the insulating film 16 is provided over the conductive film 14 and the conductive film 15. FIG. 4A is a plan view of the transistor 10. Note that to clarify the layout of the transistor 10, a variety of insulating films are omitted in FIG. 4A. FIG. 4B shows a circuit symbol of the transistor 10 illustrated in FIG. 4A. FIG. 4C is a cross-sectional view taken along dashed line A1-A2 in the plan view in FIG. 4A. FIG. 4D is a cross-sectional view taken along dashed line B1-B2 in the plan view in FIG. 4A.

The transistor 10 illustrated in FIGS. 4A, 4C, and 4D includes the conductive film 14 and the conductive film 15 that function as a source electrode (S) and a drain electrode (D) denoted by circuit symbols in FIG. 4B and are connected to side and top portions of the semiconductor film 12 in the impurity region 12b and the impurity region 12c. In FIGS. 4A, 4C, and 4D, the insulating film 16 is provided over the semiconductor film 12, the insulating film 13, the conductive film 17, the conductive film 14, and the conductive film 15.

In a manner similar to that the transistors 10 in FIGS. 1A to 1D and FIGS. 2A to 2D, in the transistors 10 in FIGS. 3A to 3D and FIGS. 4 to 4D, the side and top portions of the semiconductor film 12 in the channel formation region 12a and the conductive film 17 overlap each other, whereby carriers flow in a wide range including the side and top portions of the channel formation region 12a. Therefore, an area on the substrate occupied by the channel formation region 12a of the semiconductor film 12 can be reduced and the amount of carriers transferred in the transistor 10 can be increased. As a result, the on-state current of the transistor 10 is increased and the field-effect mobility of the transistor 10 is also increased. On the assumption that the length of the semiconductor film 12 in the channel formation region 12a in the channel width direction (the channel width) is W, and the thickness of the semiconductor film 12 in the channel formation region 12a is T, when the aspect ratio that corresponds to the ratio of the thickness T to the channel width W is high, a region where carrier flows becomes wider. Thus, the on-state current of the transistor 10 is further increased and the field-effect mobility of the transistor 10 is further increased.

As described above, in the case of the transistor 10 using the semiconductor film 12 that is a thin film, the aspect ratio is preferably such that the high crystallinity of the semiconductor film 12 can be ensured. In the case where the semiconductor film 12 contains silicon or the case where the semiconductor film 12 contains silicon and germanium, in consideration of ensuring the high crystallinity of the semiconductor film 12, specifically, the thickness T is preferably greater than or equal to 5 nm and less than or equal to 150 nm, and further preferably greater than or equal to 20 nm and less than or equal to 100 nm. On the assumption that the thickness T falls within the above range, in consideration of the resolution of an exposure apparatus which is approximately several micrometers in the case of using a glass substrate, the specific aspect ratio is preferably greater than or equal to 0.05 and less than or equal to 10, and further preferably greater than or equal to 0.1 and less than or equal to 5, and still further preferably greater than or equal to 1 and less than or equal to 5.

Furthermore, in a manner similar to that of the transistors 10 illustrated in FIGS. 1A to 1D and FIGS. 2A to 2D, also in the transistors 10 illustrated in FIGS. 3A to 3D and FIGS. 4A to 4D, the conductive films 14 and 15 are connected to the side and top portions of the semiconductor film 12 in the impurity regions 12b and 12c, respectively. Therefore, as compared to the case where the conductive films 14 and 15 are connected to only the top portion of the semiconductor film 12, areas where the conductive films 14 and 15 are respectively in contact with the impurity regions 12b and 12c can be large. Accordingly, contact resistance between the conductive films 14 and 15 and the impurity regions 12b and 12c can be reduced; as a result, the on-state current of the transistor 10 can be increased.

Also in the transistor 10 illustrated in FIGS. 4A to 4D, the conductive film 20 functioning as a gate electrode (BG) is provided on the back channel region side. The conductive film 20 is connected to the conductive film 17. The above structure can prevent generation of fixed charge in the back channel region in the transistor 10 in FIGS. 4A to 4D, which can reduce the off-state current. Furthermore, in the transistor 10 in FIGS. 4A to 4D, since the conductive film 20 is connected to the conductive film 17, the on-state current can be increased as compared to that in the transistor 10 in FIGS. 1A to 1D because a region in which carriers move extends over a large area.

Moreover, in the transistor 10 in FIGS. 4A to 4D, the conductive film 20 is provided below the semiconductor film 12 so as to be positioned below the channel formation region 12a, and the conductive film 17 is provided over the semiconductor film 12 so as to overlap the channel formation region 12a. Therefore, the semiconductor film 12 is supported from above and below by the conductive film 17 and the conductive film 20; thus, the transistor 10 can have high strength against stress as compared to the transistor 10 in FIGS. 1A to 1D.

Structure Example 4 of Transistor

The transistors 10 in FIGS. 2A to 2D and FIGS. 4A to 4D are each an example in which the conductive film 17 is connected to the conductive film 20. In the transistor 10 of one embodiment of the present invention, the conductive film 17 may be electrically isolated from the conductive film 20.

Figure 5A:
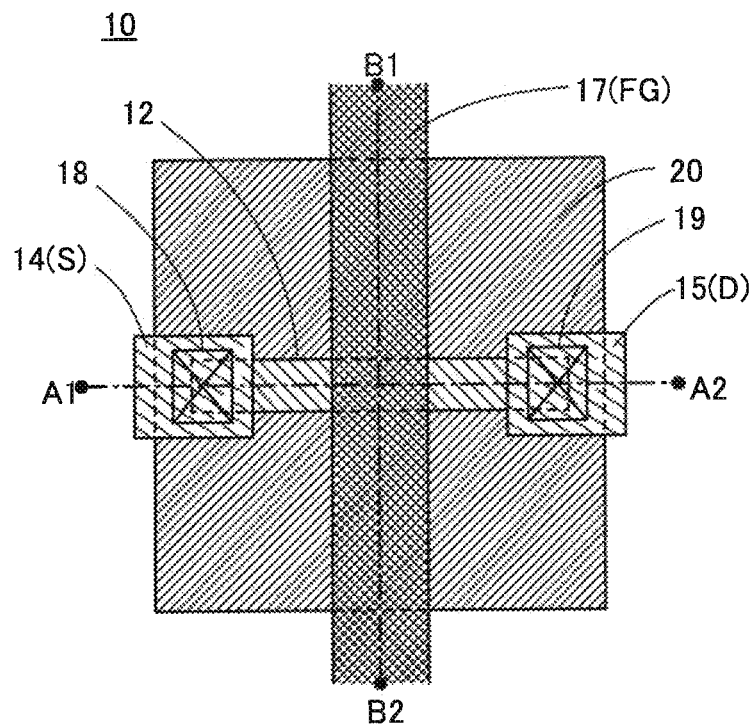
FIGS. 5A to 5D illustrate a structure of a transistor.
Figure 5B:
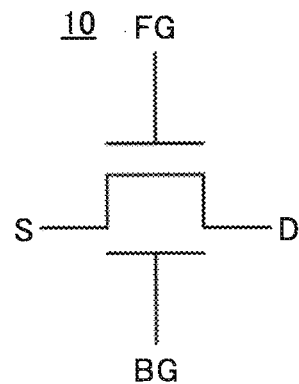
Figure 5C:
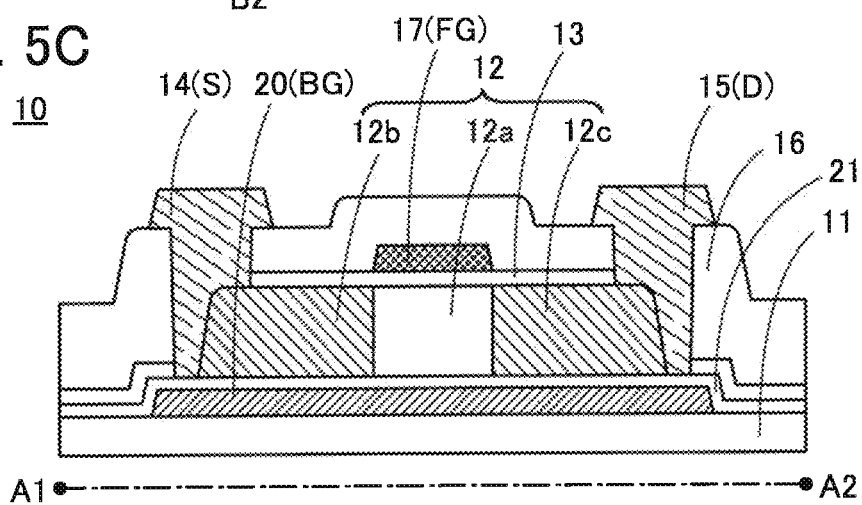
Figure 5D:
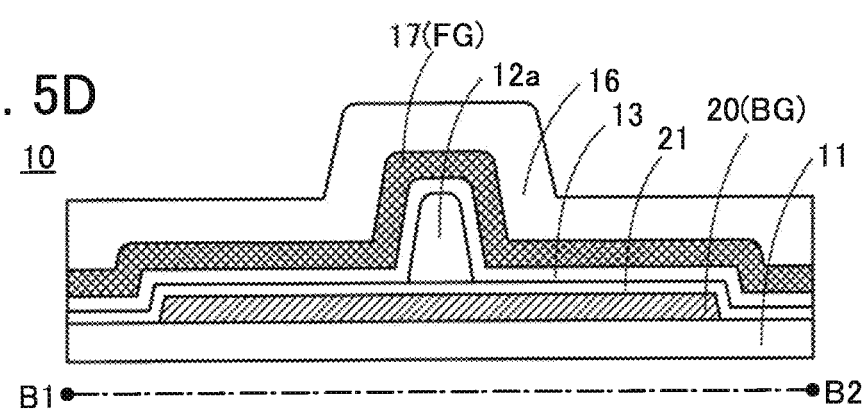

The transistor 10 illustrated in FIGS. 5A to 5D is different from the transistor 10 in FIGS. 2A to 2D in that the conductive film 17 is electrically isolated from the conductive film 20. FIG. 5A is a plan view of the transistor 10. Note that to clarify the layout of the transistor 10, a variety of insulating films are omitted in FIG. 5A. FIG. 5B shows a circuit symbol of the transistor 10 illustrated in FIG. 5A. FIG. 5C is a cross-sectional view taken along dashed line A1-A2 in the plan view in FIG. 5A. FIG. 5D is a cross-sectional view taken along dashed line B1-B2 in the plan view in FIG. 5A.

The transistor 10 illustrated in FIGS. 5A, 5C, and 5D includes the conductive film 20 that functions as a gate electrode (BG) denoted by a circuit symbol in FIG. 5B. In addition, the transistor 10 includes the conductive film 17 that functions as a gate electrode (FG) denoted by a circuit symbol in FIG. 5B, and overlaps side and top portions of the semiconductor film 12 in the channel formation region 12*a* with the insulating film 13 positioned therebetween. As illustrated in FIGS. 5A, 5C, and 5D, the conductive film 17 is electrically isolated from the conductive film 20.

In a manner similar to that the transistors 10 in FIGS. 2A to 2D and FIGS. 4A to 4D, in the transistor 10 in FIGS. 5A to 5D, the side and top portions of the semiconductor film 12 in the channel formation region 12*a* and the conductive film 17 overlap each other, whereby carriers flow in a wide range including the side and top portions of the channel formation region 12*a*. Therefore, an area on the substrate occupied by the channel formation region 12*a* of the semiconductor film 12 can be reduced and the amount of carriers transferred in the transistor 10 can be increased. As a result, the on-state current of the transistor 10 is increased and the field-effect mobility of the transistor 10 is also increased. On the assumption that the length of the semiconductor film 12 in the channel formation region 12*a* in the channel width direction (the channel width) is W, and the thickness of the semiconductor film 12 in the channel formation region 12*a* is T, when the aspect ratio that corresponds to the ratio of the thickness T to the channel width W is high, a region where carrier flows becomes wider. Thus, the on-state current of the transistor 10 is further increased and the field-effect mobility of the transistor 10 is further increased.

As described above, in the case of the transistor 10 using the semiconductor film 12 that is a thin film, the aspect ratio is preferably such that the high crystallinity of the semiconductor film 12 can be ensured. In the case where the semiconductor film 12 contains silicon or the case where the semiconductor film 12 contains silicon and germanium, in consideration of ensuring the high crystallinity of the semiconductor film 12, specifically, the thickness T is preferably greater than or equal to 5 nm and less than or equal to 150 nm, and further preferably greater than or equal to 20 nm and less than or equal to 100 nm. On the assumption that the thickness T falls within the above range, in consideration of the resolution of an exposure apparatus which is approximately several micrometers in the case of using a glass substrate, the specific aspect ratio is preferably greater than or equal to 0.05 and less than or equal to 10, and further preferably greater than or equal to 0.1 and less than or equal to 5, and still further preferably greater than or equal to 1 and less than or equal to 5.

Furthermore, in a manner similar to that of the transistors 10 illustrated in FIGS. 2A to 2D and FIGS. 4A to 4D, also in the transistor 10 illustrated in FIGS. 5A to 5D, the conductive films 14 and 15 are connected to the side and top portions of the semiconductor film 12 in the impurity regions 12*b* and 12*c*, respectively. Therefore, as compared to the case where the conductive films 14 and 15 are connected to only the top portion of the semiconductor film 12, areas where the conductive films 14 and 15 are respectively in contact with the impurity regions 12*b* and 12*c* can be large. Accordingly, contact resistance between the conductive films 14 and 15 and the impurity regions 12*b* and 12*c* can be reduced; as a result, the on-state current of the transistor 10 can be increased.

In the transistor 10 illustrated in FIGS. 5A to 5D, the conductive film 20 functioning as a gate electrode (BG) is provided on the back channel region side. Therefore, in the transistor 10 in FIGS. 5A to 5D, generation of fixed charge in the back channel region can be inhibited by supplying a predetermined potential to the conductive film 20, which can reduce the off-state current. Furthermore, in the transistor 10 in FIGS. 5A to 5D, the threshold voltage of the transistor 10 can be controlled to a desired value by a potential supplied to the conductive film 17.

Moreover, in the transistor 10 in FIGS. 5A to 5D, the conductive film 20 is provided below the semiconductor film 12 so as to be positioned below the channel formation region 12*a*, and the conductive film 17 is provided over the semiconductor film 12 so as to overlap the channel formation region 12*a*. Therefore, the semiconductor film 12 is supported from above and below by the conductive film 17 and the conductive film 20; thus, the transistor 10 can have high strength against stress as compared to the transistor 10 in FIGS. 1A to 1D.

FIGS. 5A to 5D illustrate a structure example of the transistor 10 in which the conductive film 14 and the conductive film 15 functioning as a source electrode and a drain electrode are provided over the insulating film 16, and the conductive film 14 and the conductive film 15 are respectively connected to the impurity region 12*b* and the impurity region 12*c* through opening portions of the insulating film 16, in a manner similar to that of the transistor 10 in FIGS. 2A to 2D. Note that in one embodiment of the present invention, the insulating film 16 may be provided over the conductive film 14 and the conductive film 15 in the transistor 10 in FIGS. 5A to 5D, in a manner similar to that in the transistor 10 in FIGS. 4A to 4D.

Structure Example 5 of Transistor

Next, FIGS. 6A to 6D illustrate a structure example of the transistor 10 in which a conductive film electrically connected to the conductive film 20 is provided in the same layer as the conductive film 17. FIG. 6A is a plan view of the transistor 10. Note that to clarify the layout of the transistor 10, a variety of insulating films are omitted in FIG. 6A. FIG. 6B shows a circuit symbol of the transistor 10 illustrated in FIG. 6A. FIG. 6C is a cross-sectional view taken along dashed line A1-A2 in the plan view in FIG. 6A. FIG. 6D is a cross-sectional view taken along dashed line B1-B2 in the plan view in FIG. 6A.

The transistor 10 illustrated in FIGS. 6A, 6C, and 6D includes the conductive film 20 that functions as a gate electrode (BG) denoted by a circuit symbol in FIG. 6B, over the substrate 11 having an insulating surface. Furthermore, the transistor 10 includes the insulating film 21 that functions as a gate insulating film and covers the conductive film 20. Moreover, the transistor 10 includes the semiconductor film 12 overlapping the conductive film 20 with the insulating film 21 positioned therebetween. The semiconductor film 12 includes the channel formation region 12a and the impurity regions 12b and 12c between which the channel formation region 12a is positioned. Furthermore, the transistor 10 includes the insulating film 13 that functions as a gate insulating film and covers side and top portions of the semiconductor film 12 in the channel formation region 12a. In addition, the transistor 10 includes the conductive film 17 that functions as a gate electrode (FG) denoted by a circuit symbol in FIG. 6B, and overlaps side and top portions of the semiconductor film 12 in the channel formation region 12a with the insulating film 13 positioned therebetween. Moreover, the transistor 10 includes the conductive films 14 and 15 that function as a source electrode (S) and a drain electrode (D) denoted by circuit symbols in FIG. 6B, and that are connected to side and top portions of the semiconductor film 12 in the impurity regions 12b and 12c, and includes a conductive film 24 connected to the conductive film 17.

FIGS. 6A, 6C, and 6D illustrate an example in which the insulating film 16 is provided over the semiconductor film 12, the insulating film 13, and the conductive film 17, and the conductive films 14, 15, and 24 are provided over the insulating film 16. In addition, the conductive film 14 and the conductive film 15 are connected to the impurity region 12b and the impurity region 12c through an opening portion 18 and an opening portion 19, respectively, and the conductive film 24 is connected to the conductive film 17 through an opening portion 25 of the insulating film 16.

In addition, in FIGS. 6A, 6C, and 6D, an opening portion 28 and an opening portion 29 face each other with the semiconductor film 12 positioned therebetween.

Furthermore, in FIGS. 6A, 6C, and 6D, a conductive film 26 and a conductive film 27 are provided in the same layer as the conductive film 17, specifically, over the insulating film 13. The conductive film 26 and the conductive film 27 are connected to the conductive film 20 through an opening portion 28 and an opening portion 29 of the insulating film 13 and the insulating film 21.

As illustrated in FIGS. 6A to 6D, in the transistor 10 of one embodiment of the present invention, the side and top portions of the semiconductor film 12 in the channel formation region 12a and the conductive film 17 overlap each other, whereby carriers flow in a wide range including the side and top portions of the channel formation region 12a. Therefore, an area on the substrate occupied by the channel formation region 12a of the semiconductor film 12 can be reduced and the amount of carriers transferred in the transistor 10 can be increased. As a result, the on-state current of the transistor 10 is increased and the field-effect mobility of the transistor 10 is also increased. On the assumption that the length of the semiconductor film 12 in the channel formation region 12a in the channel width direction (the channel width) is W, and the thickness of the semiconductor film 12 in the channel formation region 12a is T, when the aspect ratio that corresponds to the ratio of the thickness T to the channel width W is high, a region where carrier flows becomes wider. Thus, the on-state current of the transistor 10 is further increased and the field-effect mobility of the transistor 10 is further increased.

As described above, in the case of the transistor 10 using the semiconductor film 12 that is a thin film, the aspect ratio is preferably such that the high crystallinity of the semiconductor film 12 can be ensured. In the case where the semiconductor film 12 contains silicon or the case where the semiconductor film 12 contains silicon and germanium, in consideration of ensuring the high crystallinity of the semiconductor film 12, specifically, the thickness T is preferably greater than or equal to 5 nm and less than or equal to 150 nm, and further preferably greater than or equal to 20 nm and less than or equal to 100 nm. On the assumption that the thickness T falls within the above range, in consideration of the resolution of an exposure apparatus which is approximately several micrometers in the case of using a glass substrate, the specific aspect ratio is preferably greater than or equal to 0.05 and less than or equal to 10, and further preferably greater than or equal to 0.1 and less than or equal to 5, and still further preferably greater than or equal to 1 and less than or equal to 5.

Furthermore, as illustrated in FIGS. 6A to 6D, in the transistor 10 of one embodiment of the present invention, the conductive films 14 and 15 are connected to the side and top portions of the semiconductor film 12 in the impurity regions 12b and 12c, respectively. Therefore, as compared to the case where the conductive films 14 and 15 are connected to only the top portion of the semiconductor film 12, areas where the conductive films 14 and 15 are respectively in contact with the impurity regions 12b and 12c can be large. Accordingly, contact resistance between the conductive films 14 and 15 and the impurity regions 12b and 12c can be reduced; as a result, the on-state current of the transistor 10 can be increased.

In the transistor 10 illustrated in FIGS. 6A to 6D, the conductive film 20 functioning as a gate electrode (BG) is provided on the back channel region side. Therefore, in the transistor 10 in FIGS. 6A to 6D, generation of fixed charge in the back channel region can be inhibited by supplying a predetermined potential to the conductive film 20 through the conductive film 26 or the conductive film 27 connected to the conductive film 20, which can reduce the off-state current. Furthermore, in the transistor 10 in FIGS. 6A to 6D, the threshold voltage of the transistor 10 can be controlled to a desired value by a potential supplied to the conductive film 17.

Moreover, in the transistor 10 in FIGS. 6A to 6D, the conductive film 20 is provided below the semiconductor film 12 so as to be positioned below the channel formation region 12a, and the conductive film 17 is provided over the semiconductor film 12 so as to overlap the channel formation region 12a. Therefore, the semiconductor film 12 is supported from above and below by the conductive film 17 and the conductive film 20; thus, the transistor 10 can have high strength against stress as compared to the transistor 10 in FIGS. 1A to 1D.

Structure Example 6 of Transistor

The transistor 10 in FIGS. 2A to 2D illustrate the example in which the conductive film 17 is connected to the conductive film 20 through the opening portion 22 and the opening portion 23, which face each other with the semiconductor film 12 positioned therebetween. In the transistor 10 of one embodiment of the present invention, the conductive film 17 may be connected to the conductive film 20 through an opening portion existing on one side of the semiconductor film 12.

Figure 7A:
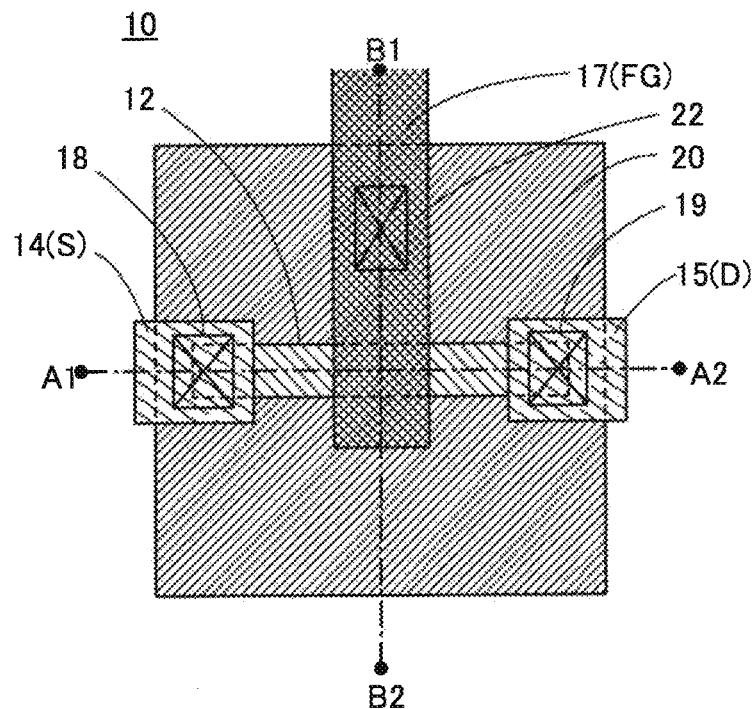
FIGS. 7A to 7D illustrate a structure of a transistor.
Figure 7B:
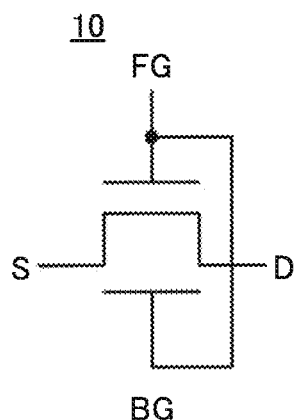
Figure 7C:
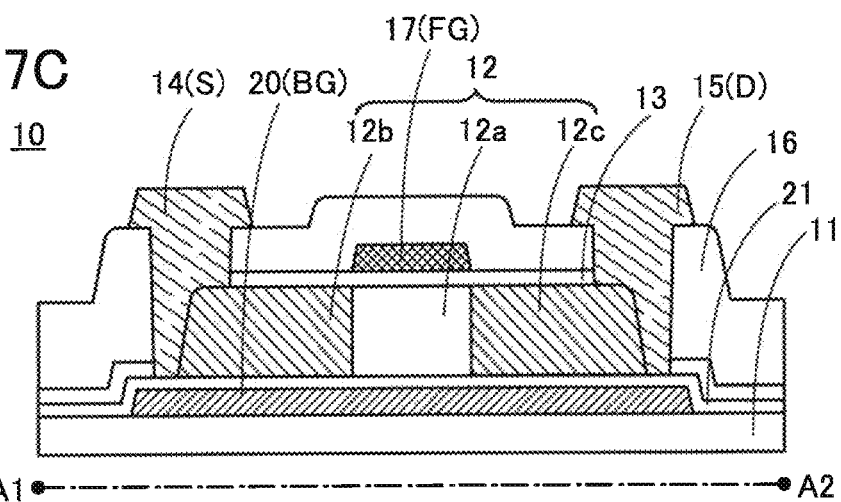
Figure 7D:
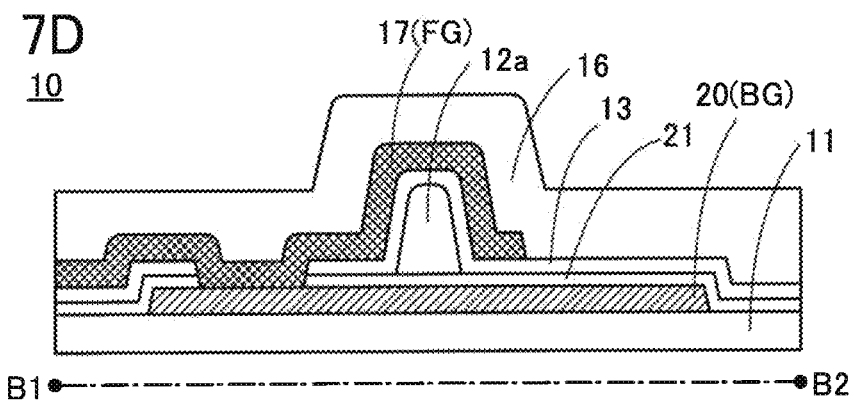

The transistor 10 in FIGS. 7A to 7D is different from the transistor 10 in FIGS. 2A to 2D in that the conductive film 17 is connected to the conductive film 20 through the opening portion 22 existing on one side of the semiconductor film 12. FIG. 7A is a plan view of the transistor 10. Note that to clarify the layout of the transistor 10, a variety of insulating films are omitted in FIG. 7A. FIG. 7B shows a circuit symbol of the transistor 10 illustrated in FIG. 7A. FIG. 7C is a cross-sectional view taken along dashed line A1-A2 in the plan view in FIG. 7A. FIG. 7D is a cross-sectional view taken along dashed line B1-B2 in the plan view in FIG. 7A.

Specifically, in the transistor 10 in FIGS. 7A, 7C, and 7D, the conductive film 17 functioning as a gate electrode (FG) denoted by a circuit symbol in FIG. 7B is connected to the conductive film 20 functioning as a gate electrode (BG) denoted by a circuit symbol in FIG. 7B, through the opening portion 22 of the insulating films 13 and 21.

Note that FIGS. 7A to 7D illustrate the structure example of the transistor 10 in which the conductive film 14 and the conductive film 15 functioning as a source electrode and a drain electrode are provided over the insulating film 16, and the conductive film 14 and the conductive film 15 are respectively connected to the impurity region 12b and the impurity region 12c through the opening portions of the insulating film 16, in a manner similar to that of the transistor 10 illustrated in FIGS. 2A to 2D. Note that in one embodiment of the present invention, the insulating film 16 may be provided over the conductive film 14 and the conductive film 15 in the transistor 10 in FIGS. 7A to 7D, in a manner similar to that of the transistor 10 in FIGS. 4A to 4D.

In a manner similar to that the transistors 10 in FIGS. 1A to 1D and FIGS. 2A to 2D, in the transistor 10 in FIGS. 7A to 7D, the side and top portions of the semiconductor film 12 in the channel formation region 12a and the conductive film 17 overlap each other, whereby carriers flow in a wide range including the side and top portions of the channel formation region 12a. Therefore, an area on the substrate occupied by the channel formation region 12a of the semiconductor film 12 can be reduced and the amount of carriers transferred in the transistor 10 can be increased. As a result, the on-state current of the transistor 10 is increased and the field-effect mobility of the transistor 10 is also increased. On the assumption that the length of the semiconductor film 12 in the channel formation region 12a in the channel width direction (the channel width) is W, and the thickness of the semiconductor film 12 in the channel formation region 12a is T, when the aspect ratio that corresponds to the ratio of the thickness T to the channel width W is high, a region where carrier flows becomes wider. Thus, the on-state current of the transistor 10 is further increased and the field-effect mobility of the transistor 10 is further increased.

As described above, in the case of the transistor 10 using the semiconductor film 12 that is a thin film, the aspect ratio is preferably such that the high crystallinity of the semiconductor film 12 can be ensured. In the case where the semiconductor film 12 contains silicon or the case where the semiconductor film 12 contains silicon and germanium, in consideration of ensuring the high crystallinity of the semiconductor film 12, specifically, the thickness T is preferably greater than or equal to 5 nm and less than or equal to 150 nm, and further preferably greater than or equal to 20 nm and less than or equal to 100 nm. On the assumption that the thickness T falls within the above range, in consideration of the resolution of an exposure apparatus which is approximately several micrometers in the case of using a glass substrate, the specific aspect ratio is preferably greater than or equal to 0.05 and less than or equal to 10, and further preferably greater than or equal to 0.1 and less than or equal to 5, and still further preferably greater than or equal to 1 and less than or equal to 5.

Furthermore, in a manner similar to that of the transistors 10 illustrated in FIGS. 1A to 1D and FIGS. 2A to 2D, also in the transistor 10 illustrated in FIGS. 7A to 7D, the conductive films 14 and 15 are connected to the side and top portions of the semiconductor film 12 in the impurity regions 12b and 12c, respectively. Therefore, as compared to the case where the conductive films 14 and 15 are connected to only the top portion of the semiconductor film 12, areas where the conductive films 14 and 15 are respectively in contact with the impurity regions 12b and 12c can be large. Accordingly, contact resistance between the conductive films 14 and 15 and the impurity regions 12b and 12c can be reduced; as a result, the on-state current of the transistor 10 can be increased.

In a manner similar to that of the transistor 10 in FIGS. 2A to 2D, also in the transistor 10 illustrated in FIGS. 7A to 7D, the conductive film 20 functioning as a gate electrode (BG) is provided on the back channel region side. The conductive film 20 is connected to the conductive film 17. The above structure can prevent generation of fixed charge in the back channel region in the transistor 10 in FIGS. 7A to 7D, which can reduce the off-state current. Furthermore, in the transistor 10 in FIGS. 7A to 7D, since the conductive film 20 is connected to the conductive film 17, the on-state current can be increased as compared to that in the transistor 10 in FIGS. 1A to 1D because a region in which carriers move extends over a large area.

Moreover, in the transistor 10 in FIGS. 7A to 7D, the conductive film 20 is provided below the semiconductor film 12 so as to be positioned below the channel formation region 12a, and the conductive film 17 is provided over the semiconductor film 12 so as to overlap the channel formation region 12a. Therefore, the semiconductor film 12 is supported from above and below by the conductive film 17 and the conductive film 20; thus, the transistor 10 can have high strength against stress as compared to the transistor 10 in FIGS. 1A to 1D.

Note that a variety of semiconductor elements may be provided between the substrate 11 and the transistor 10 in any of FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D. In this case, the transistor 10 may be provided over an insulating film covering the semiconductor elements.

In the transistor 10 in any of FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D, a state where the conductive films 14 and 15 are connected to the impurity regions 12b and 12c does not means only a state where the conductive films 14 and 15 are in direct contact with the impurity regions 12b and 12c. For example, the connected state includes a state where an insulating film such as a native oxide film that has a thickness small enough to keep electrical connection is provided between the conductive films 14 and 15 and the impurity regions 12b and 12c.

In the transistor 10 in any of FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D, in addition to the channel formation region 12a, the impurity region 12b, and the impurity region 12c, the semiconductor film 12 may include a lightly doped drain (LDD) region which has a lower concentration of an impurity imparting one conductivity type to a semiconductor than the impurity regions 12b and 12c. The LDD region can be provided between the channel formation region 12a and the impurity region 12b or between the impurity region 12c and the channel formation region 12a.

The transistor 10 in any of FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D is an example in which an end portion of the conductive film 17 overlaps a boundary between the channel formation region 12a and each of the impurity regions 12b and 12c in a cross-sectional view in the channel length direction, i.e., a cross-sectional view taken along dashed line A1-A2. Note that in one embodiment of the present invention, the conductive film 17 may overlap the boundary between the channel formation region 12a and the impurity region 12b or the boundary between the channel formation region 12a and the impurity region 12c. In this case, the conductive film 17 overlaps part of the impurity region 12b or part of the impurity region 12c with the insulating film 13 positioned therebetween. Alternatively, the end portions of the conductive film 17 may overlap the channel formation region 12a in one embodiment of the present invention. In this case, the conductive film 17 does not overlap part of the channel formation region 12a with the insulating film 13 positioned therebetween. Alternatively, in the case where the LDD region is provided in the semiconductor film 12, the conductive film 17 may overlap part of the LDD region with the insulating film 13 positioned therebetween.

Structure Example 7 of Transistor

Figure 8:
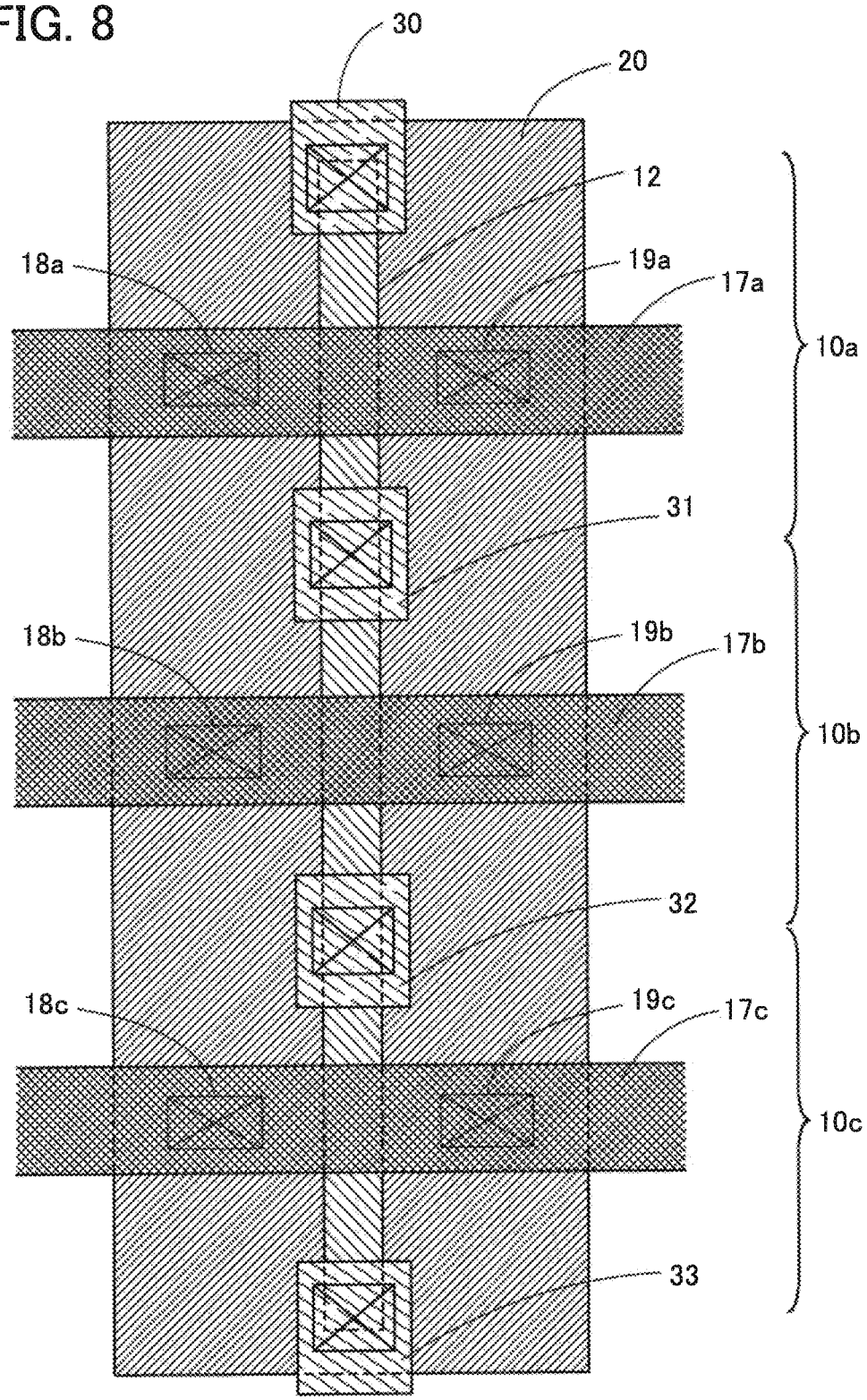
FIG. 8 illustrates structures of transistors.

FIG. 8 is an example of a plan view illustrating a plurality of transistors 10 connected in series. Each of the plurality of transistors 10 corresponds to the transistor 10 illustrated in FIGS. 2A to 2D.

Note that in this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

Specifically, FIG. 8 illustrates a state where three transistors 10, which are referred to as transistors 10a to 10c, are connected in series. Note that to clarify the layout of the transistors 10, the insulating films are omitted in FIG. 8.

The transistors 10a to 10c share the semiconductor film 12. The transistor 10a includes a conductive film 30 and a conductive film 31 that function as a source electrode and a drain electrode. The transistor 10b includes the conductive film 31 and a conductive film 32 that function as a source electrode and a drain electrode. The transistor 10c includes the conductive film 32 and a conductive film 33 that function as a source electrode and a drain electrode. Note that each of the conductive films 30 to 33 corresponds to one of the conductive film 14 and the conductive film 15 included in the transistor 10 in FIGS. 2A to 2D.

A conductive film 17a functioning as a gate electrode of the transistor 10a is connected to the conductive film 20 functioning as a gate electrode (BG), through an opening portion 18a and an opening portion 19a. A conductive film 17b functioning as a gate electrode of the transistor 10b is connected to the conductive film 20 functioning as a gate electrode (BG), through an opening portion 18b and an opening portion 19b. A conductive film 17c functioning as a gate electrode of the transistor 10c is connected to the conductive film 20 functioning as a gate electrode (BG), through an opening portion 18c and an opening portion 19c.

Figure 9:
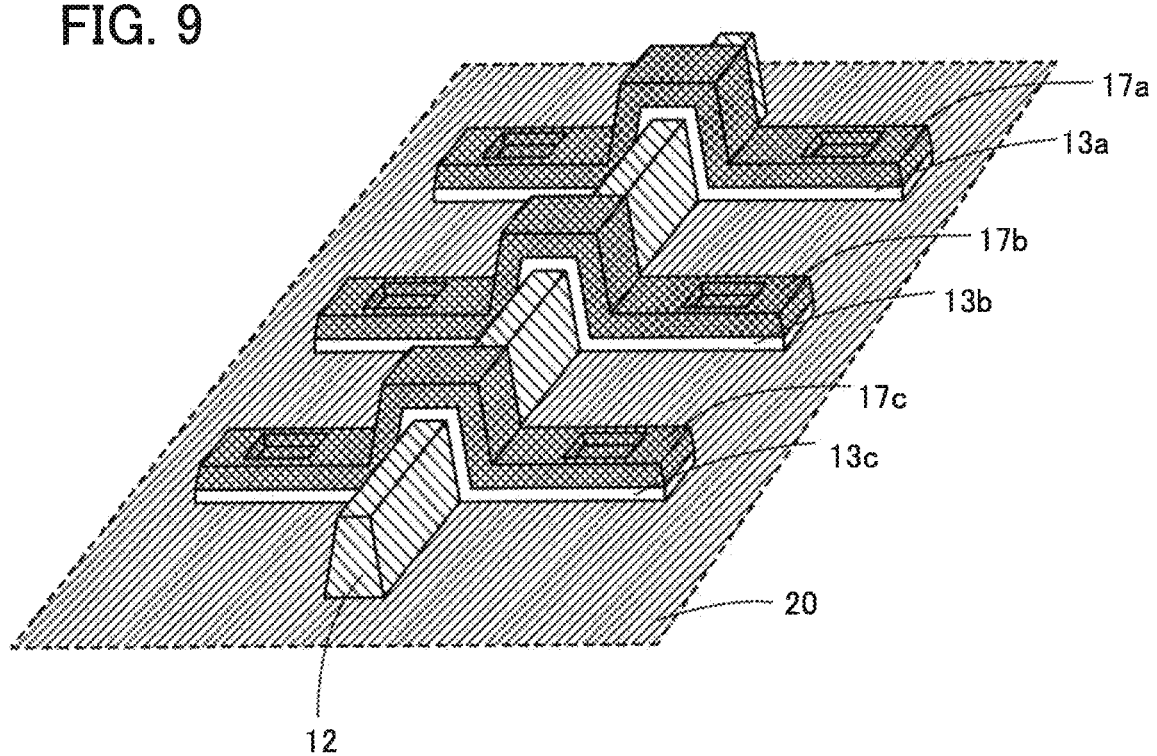
FIG. 9 illustrates structures of transistors.

FIG. 9 illustrates a perspective view of the transistors 10a to 10c in FIG. 8. Note that to clarify the shapes of the transistors 10a to 10c, among insulating films functioning as gate insulating films, insulating films provided between the conductive films 17a to 17c and the semiconductor film 12 are referred to as insulating films 13a to 13c, and the insulating films other than the insulating films 13a to 13c are omitted in FIG. 9. Furthermore, the conductive films 30 to 33 are omitted in FIG. 9.

FIG. 8 and FIG. 9 illustrate an example in which all the conductive films 17a to 17c, which are respectively included in the transistors 10a to 10c connected in series, are connected to the conductive film 20; however, the conductive films 17a to 17c may be connected to a plurality of conductive films 20 that are electrically isolated from each other.

<Manufacturing Method>

A specific method for manufacturing the transistor 10 is described with reference to FIGS. 10A and 10B, FIGS. 11A and 11B, FIGS. 12A and 12B, and FIGS. 13A and 13B, using, as examples, a transistor 10N which has the same structure as the transistor 10 in FIGS. 2A to 2D and is an n-channel transistor, and a transistor 10P which has the same structure as the transistor 10 in FIGS. 2A to 2D and is a p-channel transistor. Note that in FIGS. 10A and 10B, FIGS. 11A and 11B, FIGS. 12A and 12B, and FIGS. 13A and 13B, a cross section of a region where the transistor 10P is formed in the channel length direction corresponds a cross-sectional view along dashed line C1-C2. A cross section of a region where the transistor 10N is formed in the channel length direction corresponds to a cross-sectional view along dashed line C3-C4, and a cross section in the channel width direction corresponds a cross-sectional view along dashed line C5-C6.

First, as illustrated in FIG. 10A, an insulating film 301 is formed over a substrate 300 which has heat resistance, and then a conductive film 302 and a conductive film 303 each functioning as a gate electrode (BG) are formed over the insulating film 301.

As the substrate 300, a substrate having heat resistance high enough to withstand a later manufacturing step is preferable, and for example, a glass substrate, a quartz substrate, a ceramic substrate, a sapphire substrate, or the like is used.

The insulating film 301 has a function of preventing adverse effects on the electrical characteristics of the transistor 10P and the transistor 10N by inhibiting alkali metal and alkaline earth metal included in the substrate 300 from diffusing into a semiconductor film 306 and a semiconductor film 307, which are formed later. The insulating film 301 is formed using an insulating material such as silicon oxide, silicon nitride, silicon oxynitride, or silicon nitride oxide, by a CVD method, a sputtering method, or the like.

Each of the conductive films 302 and 303 may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten. For example, the conductive films 302 and 303 may be a conductive film in which a copper film is stacked over a tungsten nitride film or a single-layer tungsten film. In this embodiment, a 200-nm-thick tungsten film is used as the conductive films 302 and 303.

Next, as illustrated in FIG. 10B, an insulating film 304 is formed over the conductive film 302 and the conductive film 303, and a semiconductor film 305 is formed over the insulating film 304.

The insulating film 304 can be formed using a single layer or stacked layer of silicon nitride, silicon oxide, silicon nitride oxide, or silicon oxynitride, by a plasma CVD method, a sputtering method, or the like. In the case of using a stacked layer, for example, three-layer structure which is formed by stacking a silicon oxide film, a silicon nitride film and a silicon oxide film in this order from the side of the substrate 300 is preferable.

It is preferable that, after forming the insulating film 304, the semiconductor film 305 be formed without being exposed to the air. The thickness of the semiconductor film 305 is preferably greater than or equal to 5 nm and less than or equal to 150 nm, further preferably greater than or equal to 20 nm and less than or equal to 100 nm. The semiconductor film 305 may be any of an amorphous semiconductor and a polycrystalline semiconductor. Not only silicon but also silicon germanium can be used as the semiconductor. When silicon germanium is used, it is preferable that the concentration of germanium be approximately 0.01 atomic % or more and 4.5 atomic % or less.

The semiconductor film 305 may be crystallized by any of a variety of techniques. Examples of the various techniques of crystallization are a laser crystallization method using a laser beam and a crystallization method using a catalytic element. Alternatively, a crystallization method using a catalytic element and a laser crystallization method may be combined. In the case where a substrate superior in heat resistance, such as a quartz substrate, is used as the substrate 300, it is possible to combine any of the following crystallization methods: a thermal crystallization method which uses an electrically-heated furnace; a lump anneal crystallization method which uses infrared light; a crystallization method which uses a catalytic element; and high-temperature annealing at approximately 950° C. may be used.

Note that the semiconductor film 305 may be subjected to channel doping, in which an impurity element which imparts p-type conductivity or an impurity element which imparts n-type conductivity is added at a low concentration. As the p-type impurity element, boron (B), aluminum (Al), gallium (Ga), or the like can be used. As the impurity element imparting n-type conductivity, phosphorus (P), arsenic (As), or the like can be used. For example, in the case where boron (B) is used as an impurity element, channel doping is performed so that boron is contained in the semiconductor film 305 at a concentration higher than or equal to $1 \times 10^{16}$ atoms/cm$^3$ and lower than or equal to $5 \times 10^{17}$ atoms/cm$^3$.

Figure 11A:
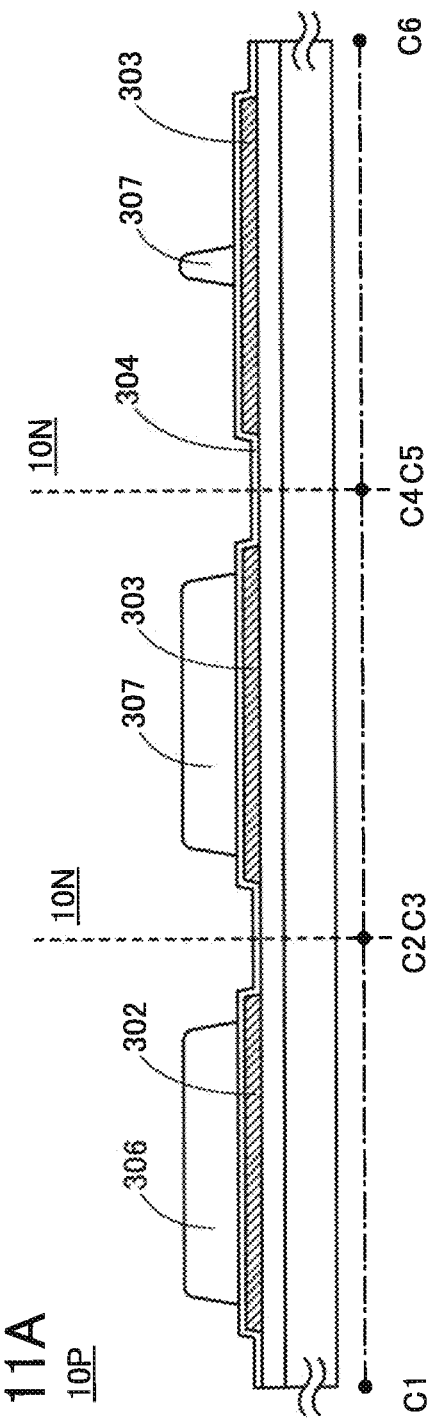
FIGS. 11A and 11B illustrate a method for manufacturing a semiconductor device.

Next, as illustrated in FIG. 11A, the semiconductor film 305 is processed by etching or the like to form the island-shaped semiconductor films 306 and 307 over the insulating film 304. The semiconductor film 306 overlaps the conductive film 302 with the insulating film 304 positioned therebetween, and the semiconductor film 307 overlaps the conductive film 303 with the insulating film 304 positioned therebetween.

Figure 11B:
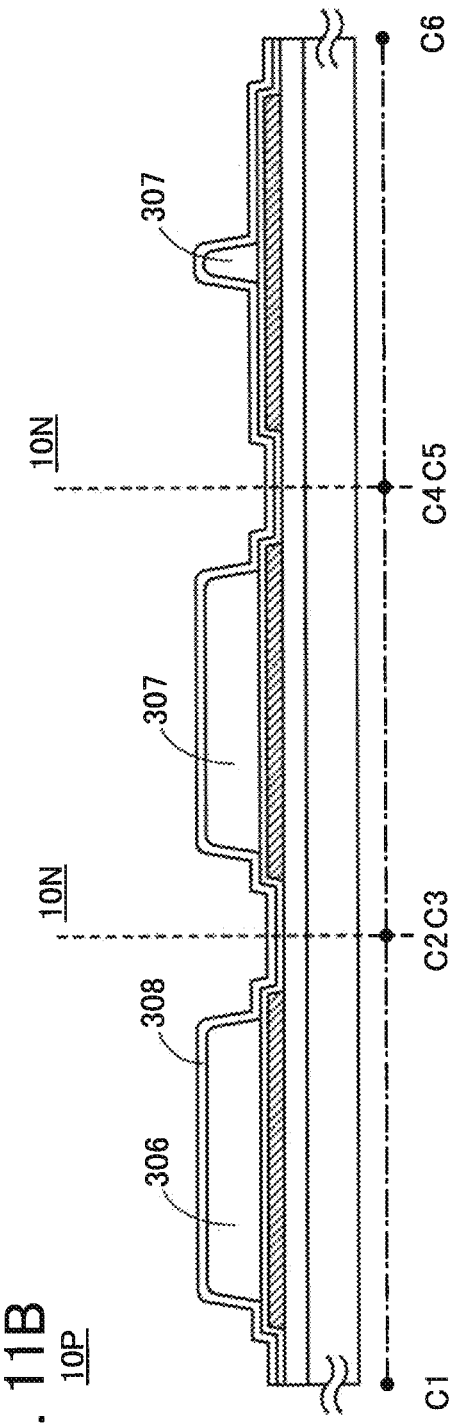

Subsequently, as illustrated in FIG. 11B, an insulating film 308 is formed to cover the semiconductor film 306 and the semiconductor film 307. The insulating film 308 may be formed using a single layer or a stacked layer of silicon nitride, silicon oxide, silicon nitride oxide, or/and silicon oxynitride by a plasma CVD method, a sputtering method, or the like. In the case of using a stacked layer, for example, a three-layer structure which is formed by stacking a silicon oxide film, a silicon nitride film and a silicon oxide film in this order from the side of the substrate 300 is preferable.

The insulating film 308 may be formed by oxidizing or nitriding the surfaces of the semiconductor films 306 and 307 by performing a high-density plasma treatment. High-density plasma treatment is performed by using, for example, a mixed gas of a rare gas such as He, Ar, Kr, or Xe; and oxygen, nitrogen oxide, ammonia, nitrogen, or hydrogen. In this case, when excitation of a plasma is performed by introducing a microwave, a plasma with a low electron temperature and a high density can be generated. The surfaces of the semiconductor films are oxidized or nitrided by an oxygen radical (there is a case where an OH radical is included) or a nitrogen radical (there is a case where an NH radical is included) generated by such high-density plasma, so that an insulating film with a thickness of greater than or equal to 1 nm and less than or equal to 20 nm, typically greater than or equal to 5 nm and less than or equal to 10 nm, is formed so as to be in contact with the semiconductor films. This insulating film with a thickness of greater than or equal to 5 nm and less than or equal to 10 nm is used as the insulating film 308.

Since oxidation or nitridation of the semiconductor film by the above-described high-density plasma treatment is progressed with solid reaction, interface state density between the gate insulating film and the semiconductor film can be extremely lowered. In addition, the semiconductor films are directly oxidized or nitrided by the high-density plasma treatment, so that variation in thickness of the insulating film to be formed can be suppressed. In the case where the semiconductor films have crystallinity, by oxidizing surfaces of the semiconductor films under a solid-phase reaction by the high-density plasma treatment, rapid oxidation can be prevented only in a crystal grain boundary; thus, a gate insulating film with good uniformity and low interface state density can be formed. When the insulating film formed by the high-density plasma treatment is included in part or all of a gate insulating film of transistors, variations in characteristics of the transistors can be suppressed.

Figure 12A:
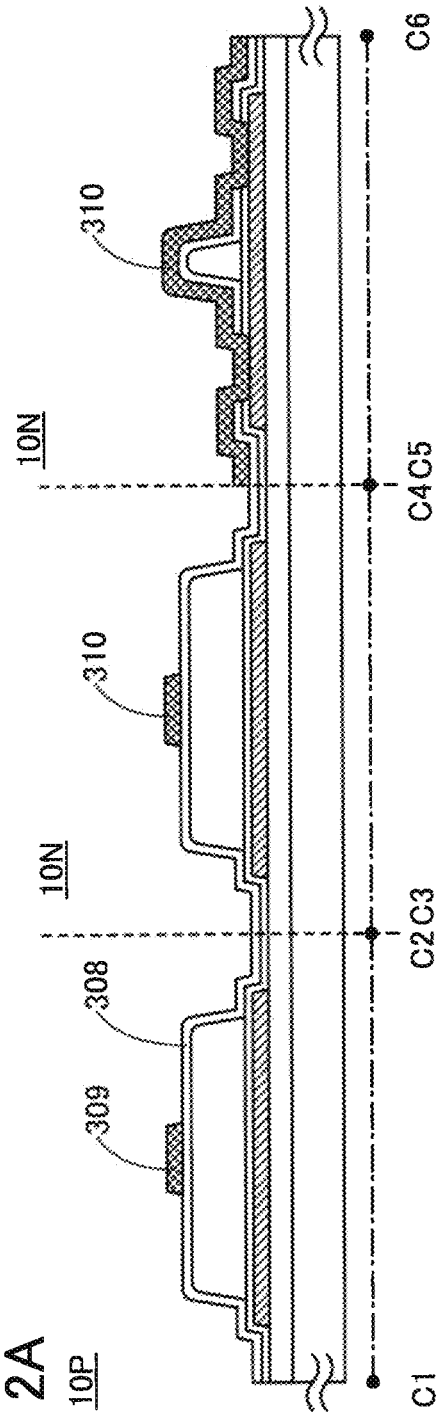
FIGS. 12A and 12B illustrate a method for manufacturing a semiconductor device.

Next, as illustrated in FIG. 12A, a conductive film is formed over the insulating film 308 and then the conductive film is processed (patterned) to have a predetermined shape, so that conductive films 309 and 310 are formed over the island-shaped semiconductor films 306 and 307. Each of the conductive films 309 and 310 may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten. The conductive films 309 and 310 can be formed by a CVD method, a sputtering method, or the like.

Figure 12B:
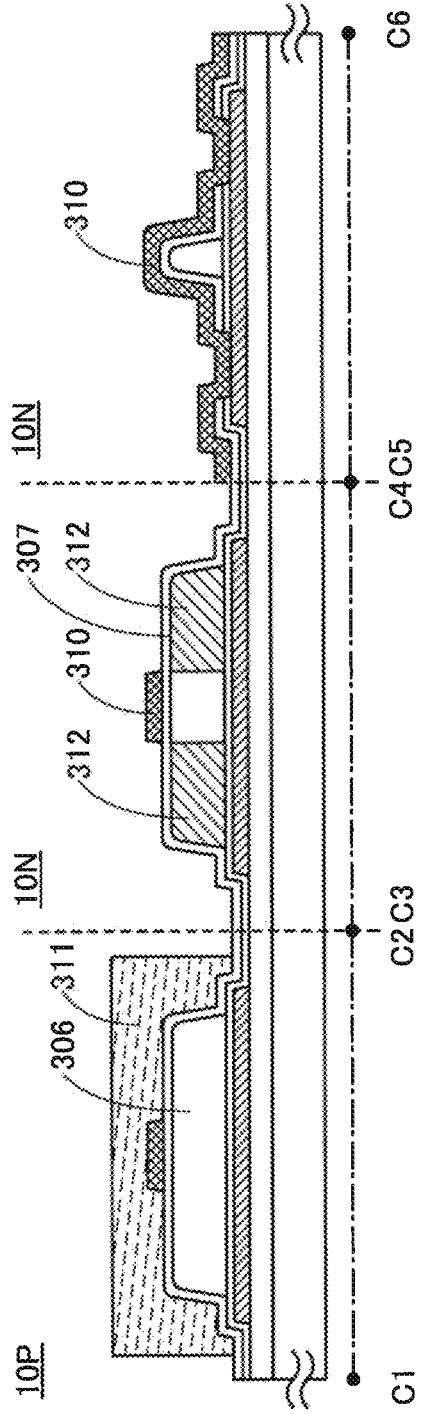

Next, as illustrated in FIG. 12B, a resist 311 is formed to cover the semiconductor film 306, and an impurity element imparting n-type conductivity (typically P or As) is added to the semiconductor film 307 using the resist 311 and the conductive film 310 as masks. The addition of the impurity element can be performed by an ion implantation method at an accelerating voltage of greater than or equal to 60 keV and less than or equal to 100 keV so that the impurity concentration of the semiconductor film 307 is higher than or equal to $1 \times 10^{19}$ atoms/cm$^3$ and lower than or equal to $1 \times 10^{20}$ atoms/cm$^3$, for example. By the addition of the impurity, a pair of impurity regions 312 is formed in the semiconductor film 307.

Then, as illustrated in FIG. 13A, a resist 313 is formed to cover the semiconductor film 307, and an impurity element imparting p-type conductivity (typically B) is added to the semiconductor film 306 using the resist 313 and the conductive film 309 as masks. The addition of the impurity element can be performed by an ion implantation method at an accelerating voltage of greater than or equal to 20 keV and less than or equal to 40 keV so that the impurity concentration of the semiconductor film 306 is higher than or equal to $1 \times 10^{19}$ atoms/cm$^3$ and lower than or equal to $1 \times 10^{20}$ atoms/cm$^3$, for example. By the addition of the impurity, a pair of impurity regions 314 is formed in the semiconductor film 306.

Next, as illustrated in FIG. 13B, an insulating film 320 is formed to cover the substrate 300, opening portions are formed in the insulating film 320, and conductive films 321 which are in contact with the impurity regions 312 through the opening portions and conductive films 322 which are in contact with the impurity regions 314 through the opening portions are formed.

The insulating film 320 is formed by a plasma CVD method, a sputtering method, or the like using a single layer or a stacked layer of any of the following films: a silicon film; a silicon oxide film; a silicon oxynitride film; a silicon nitride oxide film; and a film containing an organic material such as an organic resin with high planarity. In this embodiment, a 100-nm-thick silicon oxide film is formed by a plasma CVD method.

Each of the conductive films 321 and 322 may be formed using a single layer or a stacked layer of a conductive film containing one or more kinds selected from aluminum, titanium, chromium, cobalt, nickel, copper, yttrium, zirconium, molybdenum, ruthenium, silver, tantalum, and tungsten.

Then, the impurity regions may be activated by heat treatment. For example, the activation can be performed by heat treatment in a nitrogen atmosphere at 550° C. for four hours.

Alternatively, after a silicon nitride film containing hydrogen is formed to a thickness of 100 nm, heat treatment may be performed in a nitrogen atmosphere at 410° C. for one hour to hydrogenate the semiconductor films 306 and 307. Further alternatively, heat treatment may be performed in an atmosphere containing hydrogen at a temperature of 300° C. to 450° C. for 1 to 12 hours to hydrogenate the semiconductor films 306 and 307. The thermal treatment can be performed by a thermal annealing method, a laser annealing method, an RTA method, or the like. Through the heat treatment, not only hydrogenation, but also activation of the impurity element added to the semiconductor films can be performed. As another means for the hydrogenation, plasma hydrogenation (using hydrogen that is excited by plasma) may be performed. In the hydrogenation process, a dangling bond can be terminated by using the thermally excited hydrogen.

Through the above series of processes, the p-channel transistor 10P and the n-channel transistor 10N are formed.

Note that the transistor 10P and the transistor 10N formed by the above method may be transferred onto a flexible substrate such as a plastic substrate which is separately prepared. The semiconductor elements can be transferred to another substrate by a variety of methods. Examples of the transfer method include a method in which a metal oxide film is provided between the substrate and the semiconductor element, and the metal oxide film is embrittled by crystallization so that the semiconductor element is separated off and transferred; a method in which an amorphous silicon film containing hydrogen is provided between the substrate and the semiconductor element, and the amorphous silicon film is removed by laser beam irradiation or etching so that the semiconductor element is separated off the substrate and transferred; a method in which the substrate, for which the semiconductor element is provided, is removed by mechanical cutting or etching with a solution or a gas so that the semiconductor element is cut off the substrate and transferred; and the like.

In this case, polyester typified by polyethylene terephthalate (PET), polyether sulfone (PES), polyethylene naphthalate (PEN), polycarbonate (PC), nylon, polyether etherketone (PEEK), polysulfone (PSF), polyether imide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, or the like can be given as examples of the material of the plastic substrate.

Structure Example of Semiconductor Display Device

Next, a structure example of a semiconductor display device which corresponds to one mode of a semiconductor device of the present invention is described.

Figure 14A:
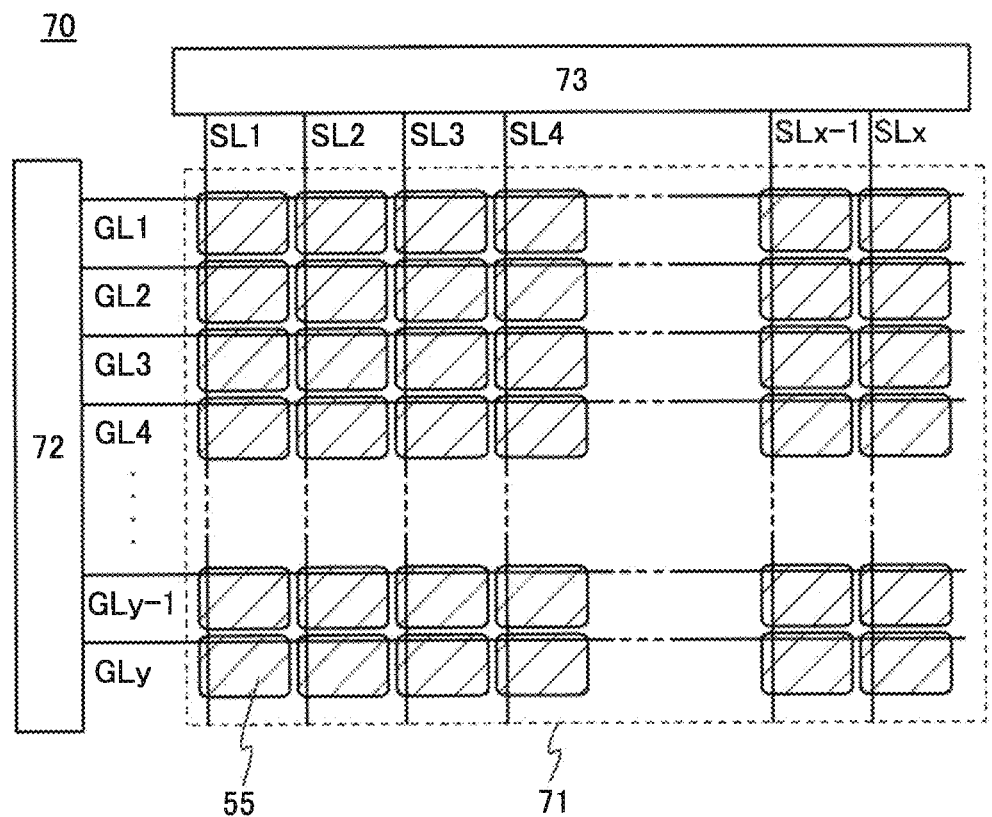
FIGS. 14A to 14C each illustrate a structure of a semiconductor display device.

In a semiconductor display device 70 illustrated in FIG. 14A, a pixel portion 71 includes a plurality of pixels 55, wirings GL (wirings GL1 to GLy; y is a natural number) for selecting the pixels 55 row by a row, and wirings SL (wirings SL1 to SLx; x is a natural number) for supplying image signals to the selected pixels 55. Supply of signals to the wirings GL is controlled by a scan line driver circuit 72. The supply of image signals to the wirings SL is controlled by a signal line driver circuit 73. Each of the plurality of pixels 55 is connected to at least one of the wirings GL and at least one of the wirings SL.

Note that the kinds and number of the wirings in the pixel portion 71 can be determined by the structure, number, and position of the pixels 55. Specifically, in the pixel portion 71 illustrated in FIG. 14A, the pixels 55 are arranged in a matrix of x columns and y rows, and the wirings SL1 to SLx and the wirings GL1 to GLy are provided in the pixel portion 71 as an example.

Although FIG. 14A illustrates the case where the scan line driver circuits 72, the signal line driver circuit 73, and the pixel portion 71 are formed over one substrate as an example, part or the whole of the signal line driver circuits 73 may be formed over a substrate different from a substrate over which the pixel portion 71 is formed. The transistors 10 illustrated in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be used for any of the scan line driver circuit 72, the signal line driver circuit 73, and the pixel portion 71.

Figure 14B:
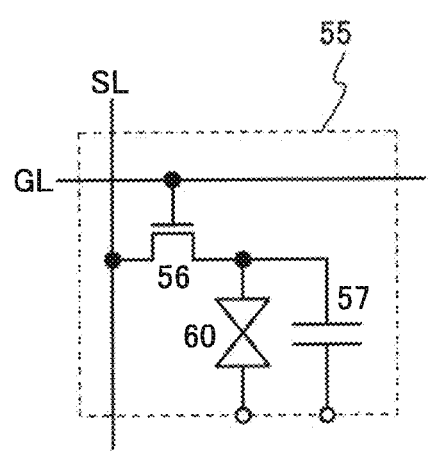

FIG. 14B illustrates a configuration example of the pixel 55. Each of the pixels 55 includes a liquid crystal element 60, a transistor 56 that controls the supply of an image signal to the liquid crystal element 60, and a capacitor 57 that holds voltage between a pixel electrode and a common electrode of the liquid crystal element 60. The liquid crystal element 60 includes the pixel electrode, the common electrode, and a liquid crystal layer containing a liquid crystal material to which voltage between the pixel electrode and the common electrode is applied.

The transistor 56 controls whether to supply the potential of the wiring SL to the pixel electrode of the liquid crystal element 60. A predetermined potential is applied to the common electrode of the liquid crystal element 60.

Connection between the transistor 56 and the liquid crystal element 60 is specifically described below. In FIG. 14B, a gate of the transistor 56 is connected to any one of the wirings GL1 to GLy. One of a source and a drain of the transistor 56 is connected to any one of the wirings SL1 to SLx, and the other is connected to the pixel electrode of the liquid crystal element 60.

The transmittance of the liquid crystal element 60 changes when the alignment of liquid crystal molecules included in the liquid crystal layer changes in accordance with the level of voltage applied between the pixel electrode and the common electrode. Accordingly, when the transmittance of the liquid crystal element 60 is controlled by the potential of an image signal supplied to the pixel electrode, gray-scale images can be displayed. In each of the plurality of pixels 55 included in the pixel portion 71, the gray level of the liquid crystal element 60 is adjusted in response to an image signal containing image data; thus, an image is displayed on the pixel portion 71.

FIG. 14B illustrates an example in which one transistor 56 is used as a switch for controlling the supply of an image signal to the pixel 55. However, a plurality of transistors functioning as one switch may be used in the pixel 55.

The on-state current of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be large. Therefore, the use of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D as the transistor 56 enables high speed supply of an image signal to the pixel 55, which can increase the image quality of the pixel 55. Furthermore, the off-state current of any of the transistors 10 in FIGS. 2A to 2D, FIGS. 4A to 4D, FIGS. 5A to 5D, FIGS. 6A to 6D, and FIGS. 7A to 7D can be small. Therefore, the use of any of the transistors 10 in FIGS. 2A to 2D and FIGS. 4A to 4D, FIGS. 5A to 5D, FIGS. 6A to 6D, and FIGS. 7A to 7D as the transistor 56 prevents charge from leaking through the transistor 56, which makes it possible to more certainly keep the potential of an image signal that has been supplied to the liquid crystal element 60 and the capacitor 57. As a result, a change in the transmittance of the liquid crystal element 60 due to leakage of charge within one frame period can be inhibited, whereby the quality of a displayed image can be improved.

Figure 14C:
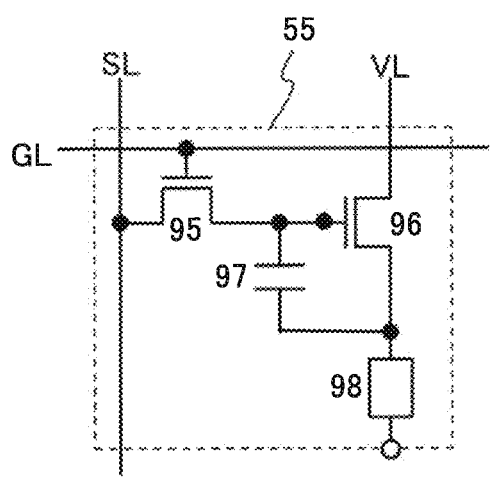

Next, FIG. 14C illustrates another example of the pixel 55. The pixel 55 includes a transistor 95 for controlling supply of an image signal to the pixel 55, a light-emitting element 98, a transistor 96 for controlling the value of current supplied to the light-emitting element 98 in response to an image signal, and a capacitor 97 for holding the potential of an image signal.

Examples of the light-emitting element 98 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 98. As electroluminescence, there are luminescence (fluorescence) at the time of returning from a singlet-excited state to a ground state and luminescence (phosphorescence) at the time of returning from a triplet-excited state to a ground state.

The potential of one of the anode and the cathode of the light-emitting element 98 is controlled in response to an image signal supplied to the pixel 55. The one of the anode and the cathode whose potential is controlled in response to an image signal is used as a pixel electrode, and the other is used as a common electrode. A predetermined potential is applied to the common electrode of the light-emitting element 98, and the luminance of the light-emitting element 98 is determined by a potential difference between the pixel electrode and the common electrode. Thus, the luminance of the light-emitting element 98 is controlled by the potential of the image signal, so that the light-emitting element 98 can express gray level. In each of the plurality of pixels 55 included in the pixel portion, the gray level of the light-emitting element 98 is adjusted in response to an image signal containing image data; thus, an image is displayed on the pixel portion 71.

Next, connection among the transistor 95, the transistor 96, the capacitor 97, and the light-emitting element 98 which are included in the pixel 55 is described.

One of a source and a drain of the transistor 95 is connected to the wiring SL, and the other is connected to a gate of the transistor 96. A gate of the transistor 95 is connected to the wiring GL. One of a source and a drain of the transistor 96 is connected to a power supply line VL, and the other is connected to the light-emitting element 98. Specifically, the other of the source and the drain of the transistor 96 is connected to any one of the anode and the cathode of the light-emitting element 98. A predetermined potential is applied to the other of the anode and the cathode of the light-emitting element 98.

The on-state current of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be large. Therefore, the use of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D, as the transistor 95, enables high speed supply of an image signal to the pixel 55, which can increase the image quality of the pixel 55. Furthermore, the off-state current of any of the transistors 10 in FIGS. 2A to 2D, FIGS. 4A to 4D, FIGS. 5A to 5D, FIGS. 6A to 6D, and FIGS. 7A to 7D can be small. Therefore, the use of any of the transistors 10 in FIGS. 2A to 2D, FIGS. 4A to 4D, FIGS. 5A to 5D, FIGS. 6A to 6D, and FIGS. 7A to 7D, as the transistor 95, prevents charge from leaking through the transistor 95, which makes it possible to more certainly keep the potential of an image signal that has been supplied to the capacitor 97. As a result, a change in the luminance of the light-emitting element 98 due to leakage of charge within one frame period can be inhibited, whereby the quality of a displayed image can be improved.

For example, in this specification and the like, a display element, a display device which is a device including a display element, a light-emitting element, and a light-emitting device which is a device including a light-emitting element can employ various modes and can include various elements. Examples of a display element, a display device, a light-emitting element, or a light-emitting device include an EL (electroluminescent) element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, an electrowetting element, a grating light valve (GLV), a plasma display panel (PDP), a display device using a micro electro mechanical system (MEMS), a digital micromirror device (DMD), a digital micro shutter (DMS), an interferometric modulator display (IMOD), a electrowetting element, a piezoelectric ceramic display, and a carbon nanotube, which are display media whose contrast, luminance, reflectivity, transmittance, or the like is changed by electromagnetic action. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper.

<Structure of Pixel>

Figure 15:
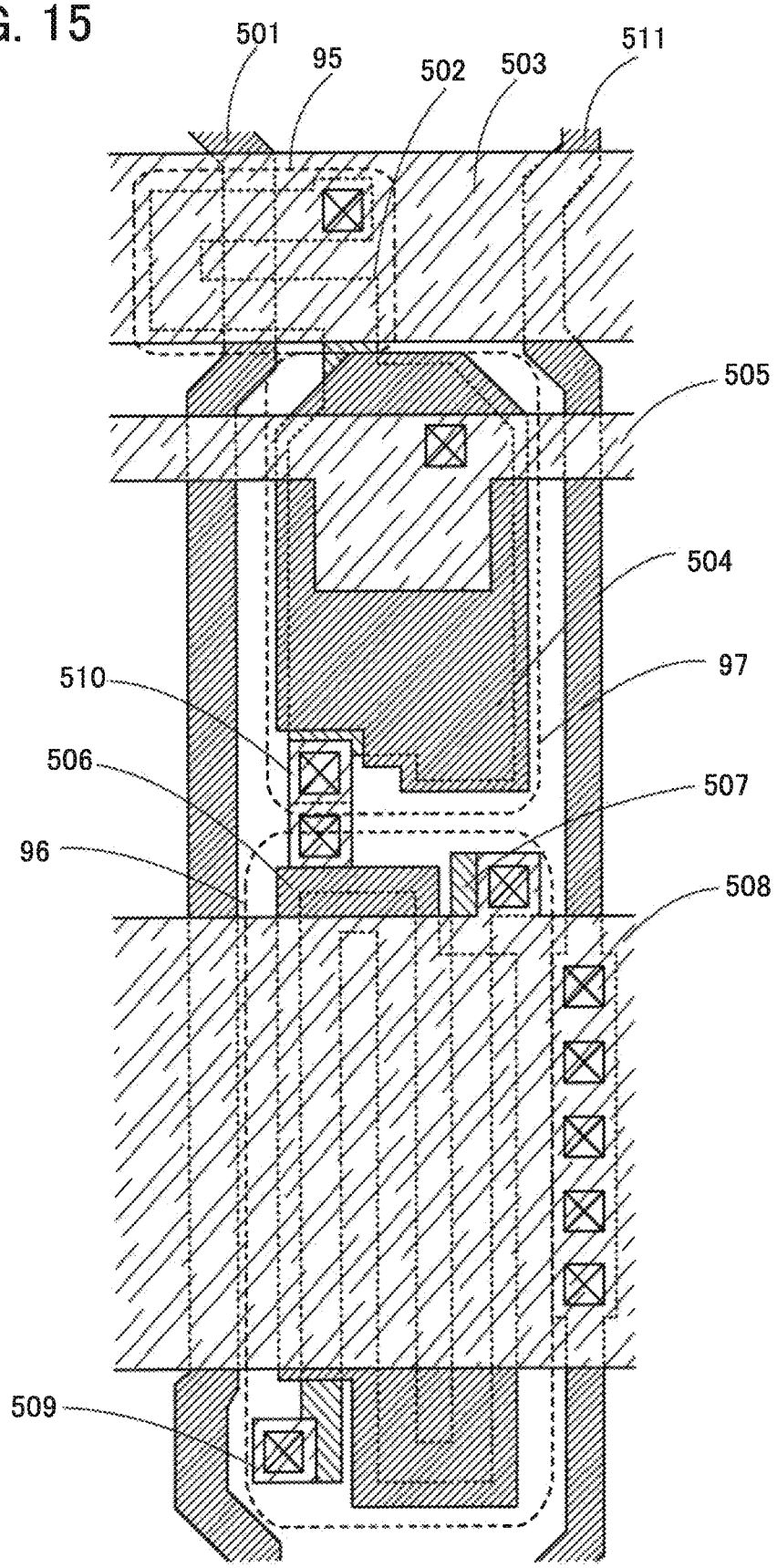
FIG. 15 is a top view of a pixel.

Next, description is given of a structure example of the pixel 55 in a light-emitting device which is an example of the semiconductor display device 70 illustrated in FIG. 14A. FIG. 15 is an example of a top view of the pixel 55 in FIG. 14C. To clarify the layout of the pixel 55, the insulating films and the light-emitting element 98 are omitted in FIG. 15.

The pixel 55 in FIG. 15 includes the transistor 95, the transistor 96, and the capacitor 97. FIG. 15 shows an example in which the transistor 95 and the transistor 96 which have the same structure as the transistor 10 in FIGS. 1A to 1D are used in the light-emitting device; however, in one embodiment of the present invention, any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be used for the light-emitting device.

The transistor 95 includes a conductive film 501 that functions as a gate electrode, a semiconductor film 502, and a conductive film 503 that is connected to the semiconductor film 502 and functions as a source electrode or a drain electrode. The conductive film 501 functions as the wiring GL illustrated in FIG. 14C. The conductive film 503 serves as the wiring SL illustrated in FIG. 14C.

The capacitor 97 includes the semiconductor film 502, a conductive film 504, and an insulating film (not illustrated) provided between the semiconductor film 502 and the conductive film 504. The conductive film 504 is connected to a conductive film 505 positioned in the same layer as the conductive film 503.

The transistor 96 includes a conductive film 506 that functions as a gate electrode, a semiconductor film 507, and a conductive film 508 and a conductive film 509 that are connected to the semiconductor film 507 and function as a source electrode and a drain electrode. Furthermore, the conductive film 509 is connected to a pixel electrode of the light-emitting element 98 in FIG. 14C. The conductive film 506 is connected to the semiconductor film 502 through a conductive film 510. The conductive film 508 is connected to a conductive film 511. The conductive film 511 functions as the wiring VL in FIG. 14C.

For the electrode serving as the anode or the cathode, any of metals, alloys, electrically conductive compounds, and mixtures thereof can be used, for example. Specifically, indium oxide-tin oxide (ITO: indium tin oxide), indium oxide-tin oxide containing silicon or silicon oxide, indium oxide-zinc oxide (indium zinc oxide), indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as calcium (Ca) or strontium (Sr), magnesium (Mg), an alloy containing such an element (MgAg, AlLi), a rare earth metal such as europium (Eu) or ytterbium (Yb), an alloy containing such an element, graphene, and the like can be used. The electrode is formed using a material selected from the above as appropriate and formed to an optimum thickness, so that a top-emission structure, a bottom-emission structure, or a dual-emission structure can be selectively formed.

For a light-emitting device in one embodiment of the present invention, it is possible to employ a color filter method in which full-color images are displayed using a combination of a color filter and a light-emitting element that emits light of a single color such as white. Alternatively, a method in which a full-color image is displayed with the use of a plurality of light-emitting elements emitting light with different hues can be employed. This method is referred to as a separate coloring method because EL layers, which are each placed between a pair of electrodes in a light-emitting element, are separately colored with their corresponding colors.

In the separate coloring method, in general, EL layers are separately deposited by vapor deposition with use of a mask such as a metal mask. Thus, the size of pixels depends on the accuracy of separate deposition of the EL layers by vapor deposition. On the other hand, unlike the separate coloring method, EL layers do not need to be separately formed in the color filter method. Accordingly, in the case of the color filter method, as compared to the separate coloring method, the pixel can be easily reduced in size, and the pixel portion with high high-definition can be formed.

In the top-emission structure, light emitted from a light-emitting element is not blocked by an element such as a wiring, a transistor, or a capacitor, so that the efficiency of light extraction from a pixel can be made higher than that in the bottom-emission structure. Accordingly, a top emission type light-emitting device can have high luminance even when the light-emitting element is supplied with low current value, and has an advantage in that the lifetime of the light-emitting element is prolonged.

In one embodiment of the present invention, the light-emitting device may have a microcavity (micro optical resonator) structure in which light emitted from an EL layer resonates within a light-emitting element. With a microcavity structure, the light-extraction efficiency of light with a particular wavelength from the light-emitting element can be increased, so that the luminance and the color purity of the pixel portion can be improved.

<Cross-Sectional Structure of Light-Emitting Device>

Figure 16:
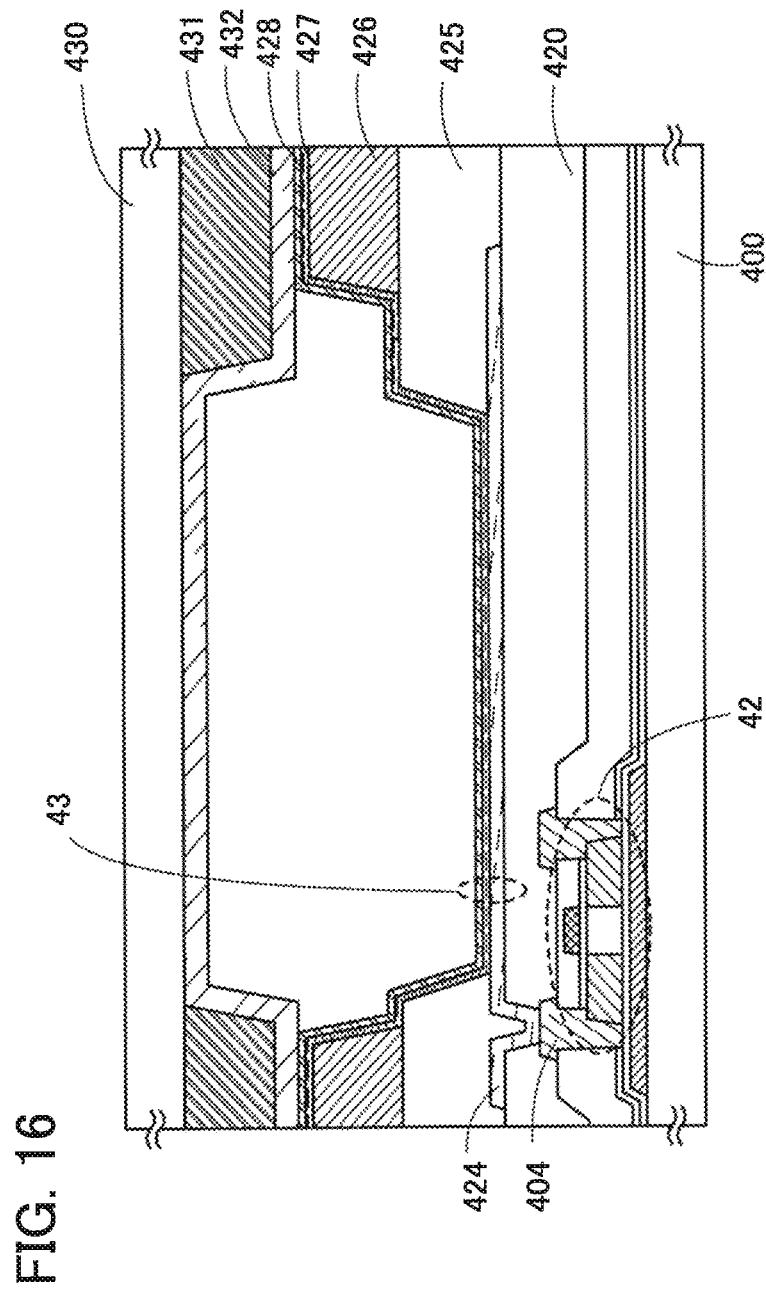
FIG. 16 is a cross-sectional view of a light-emitting device.

FIG. 16 illustrates an example of a cross-sectional structure of a pixel portion in a light-emitting device corresponding to the semiconductor device of one embodiment of the present invention.

Specifically, the light-emitting device in FIG. 16 includes a transistor 42 over a substrate 400. FIG. 16 shows an example in which the transistor 42 which has the same structure as the transistor 10 in FIGS. 2A to 2D is used in the light-emitting device; however, in one embodiment of the present invention, any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be used for the light-emitting device.

An insulating film 420 is provided over the transistor 42, and a conductive film 424 is provided over the insulating film 420. The conductive film 424 is connected to a conductive film 404 serving as a source electrode or a drain electrode of the transistor 42, through an opening portion of the insulating film 420.

An insulating film 425 is provided over the insulating film 420 and the conductive film 424. The insulating film 425 has an opening portion in a region overlapping the conductive film 424. Over the insulating film 425, an insulating film 426 is provided in a position that is different from the position of the opening portion of the insulating film 425. An EL layer 427 and a conductive film 428 are sequentially stacked over the insulating films 425 and 426. A portion in which the conductive films 424 and 428 overlap each other with the EL layer 427 positioned therebetween functions as a light-emitting element 43. One of the conductive films 424 and 428 functions as an anode, and the other of the conductive films 424 and 428 functions as a cathode.

The light-emitting device includes a substrate 430 that faces the substrate 400 with the light-emitting element 43 positioned therebetween. A blocking film 431 that has a function of blocking light is provided over the substrate 430, i.e., over a surface of the substrate 430 that is close to the light-emitting element 43. The blocking film 431 includes an opening portion in a region overlapping the light-emitting element 43. In the opening that overlaps the light-emitting element 43, a coloring layer 432 that transmits visible light in a specific wavelength range is provided over the substrate 430.

Configuration Example of Sequential Circuit

Next, a configuration example of a sequential circuit using any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D is described.

Figure 17A:
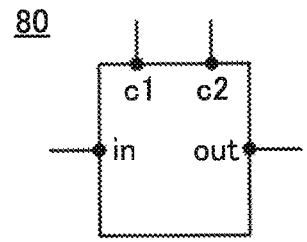
FIGS. 17A and 17B show structures of sequential circuits.
Figure 17B:
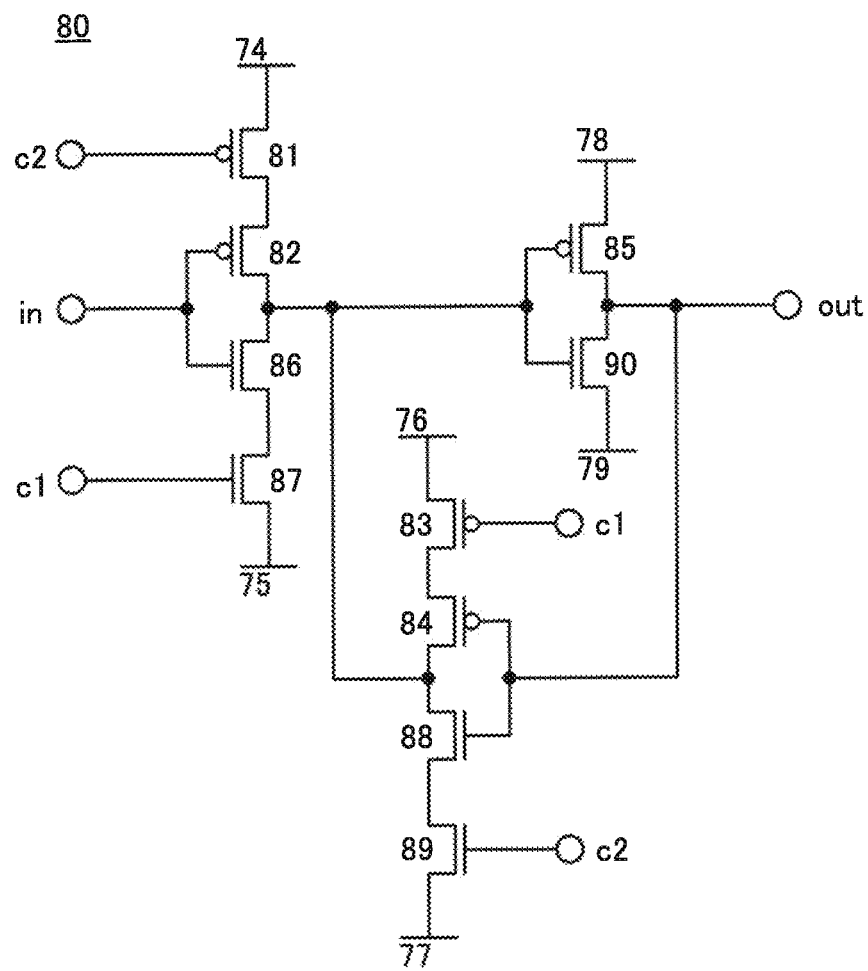

FIG. 17A schematically illustrates the positions of a variety of wirings connected to a sequential circuit 80. FIG. 17B illustrates an example of the circuit configuration of the sequential circuit 80. The sequential circuit 80 in FIG. 17B includes p-channel transistors 81 to 85 and n-channel transistors 86 to 90. Any of the structures of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D is applicable to the transistors 81 to 90.

In the sequential circuit 80, the transistor 81, the transistor 82, the transistor 86, and the transistor 87 form a clocked inverter in which whether a signal is output is controlled in accordance with signals supplied to a wiring c1 and a wiring c2.

Specifically, a gate of the transistor 81 is connected to the wiring c2; one of a source and a drain of the transistor 81 is connected to the wiring 74; and the other of the source and the drain of the transistor 81 is connected to one of a source and a drain of the transistor 82. A gate of the transistor 82 is connected to a wiring in, and the other of the source and the drain of the transistor 82 is connected to a gate of the transistor 85 and a gate of the transistor 90. A gate of the transistor 87 is connected to the wiring c1; one of a source and a drain of the transistor 87 is connected to the wiring 75; and the other of the source and the drain of the transistor 87 is connected to one of a source and a drain of the transistor 86. A gate of the transistor 86 is connected to the wiring in, and the other of the source and the drain of the transistor 86 is connected to the gate of the transistor 85 and the gate of the transistor 90.

In the sequential circuit 80, the transistor 83, the transistor 84, the transistor 88, and the transistor 89 form a clocked inverter in which whether a signal is output is controlled in accordance with signals supplied to the wiring c1 and the wiring c2.

Specifically, a gate of the transistor 83 is connected to the wiring c1; one of a source and a drain of the transistor 83 is connected to a wiring 76; and the other of the source and the drain of the transistor 83 is connected to one of a source and a drain of the transistor 84. A gate of the transistor 84 is connected to a wiring out, and the other of the source and the drain of the transistor 84 is connected to the gate of the transistor 85 and the gate of the transistor 90. A gate of the transistor 89 is connected to the wiring c2; one of a source and a drain of the transistor 89 is connected to a wiring 77; and the other of the source and the drain of the transistor 89 is connected to one of a source and a drain of the transistor 88. A gate of the transistor 88 is connected to the wiring out, and the other of the source and the drain of the transistor 88 is connected to the gate of the transistor 85 and the gate of the transistor 90.

In the sequential circuit 80, the transistor 85 and the transistor 90 form an inverter.

Specifically, one of a source and a drain of the transistor 85 is connected to a wiring 78, and the other of the source and the drain of the transistor 85 is connected to the wiring out. One of a source and a drain of the transistor 90 is connected to a wiring 79, and the other of the source and the drain of the transistor 90 is connected to the wiring out.

A low-level potential VSS is supplied to the wiring 75, the wiring 77, and the wiring 79; and a high-level potential VDD is supplied to the wiring 74, the wiring 76, and the wiring 78.

The on-state current of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be large. Therefore, the use of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D as any of the transistors 81 to 90 in the sequential circuit 80 enables high-speed operation of the sequential circuit 80. Furthermore, the off-state current of any of the transistors 10 in FIGS. 2A to 2D, FIGS. 4A to 4D, FIGS. 5A to 5D, FIGS. 6A to 6D, and FIGS. 7A to 7D can be small. Therefore, the use of any of the transistors 10 in FIGS. 2A to 2D, FIGS. 4A to 4D, FIGS. 5A to 5D, FIGS. 6A to 6D, and FIGS. 7A to 7D as any of the transistors 81 to 90 can reduce leakage current flowing between the wirings 75, 77, and 79 and the wirings 74, 76, and 78, resulting in a reduction in power consumption of the sequential circuit 80.

Configuration Example of Driver Circuit

Figure 18:
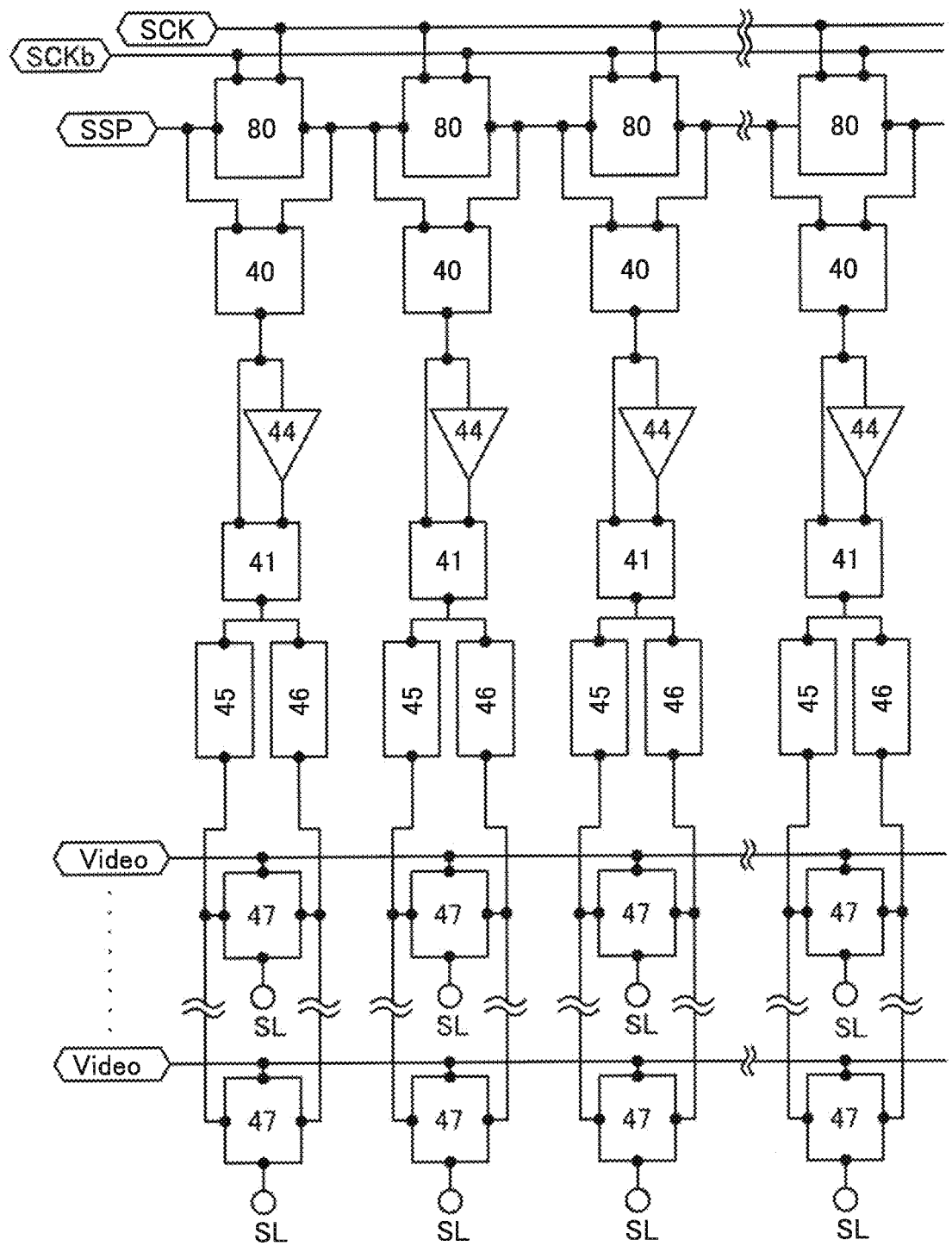
FIG. 18 illustrates a configuration of a signal line driver circuit.

Next, FIG. 18 illustrates a block diagram showing a configuration example of a signal line driver circuit using the sequential circuit 80 illustrated in FIGS. 17A and 17B. Although the block diagram shows elements classified according to their functions in independent blocks, it may be practically difficult to completely separate the elements according to their functions and, in some cases, one element may be involved in a plurality of functions.

In the signal line driver circuit illustrated in FIG. 18, a shift register is formed using a plurality of sequential circuits 80. In each of the plurality of sequential circuits 80, a start pulse signal SSP or a signal of the wiring out connected to the sequential circuit 80 in the previous stage is input to the wiring in. A clock signal SCK is input to one of the wiring c1 and the wiring c2, and a clock signal SCKb, which is obtained by inverting the logic value of the clock signal SCK is input to the other of the wiring c1 and the wiring c2.

The signal input to the wiring in and the signal input to the wiring out of each of the plurality of sequential circuits 80 are input to a pair of input terminals included in the corresponding one of a plurality of NANDs 40. A signal output from an output terminal of each of the plurality of NANDs 40 is input to one of a pair of input terminals of the corresponding one of a plurality of NORs 41. Furthermore, the signal output from the output terminal of each of the plurality of NANDs 40 is input to the other of the pair of input terminals of the corresponding one of the plurality of NORs 41 through a buffer 44. A signal output from an output terminal of each of the plurality of NORs 41 is input to a first terminal of the corresponding one of a plurality of transmission gates 47 through a buffer 45. Furthermore, the signal output from the output terminal of each of the plurality of NORs 41 is input to a second terminal of the corresponding one of the plurality of transmission gates 47 through a buffer 46.

The transmission gates 47 each have a function of controlling supply of an image signal Video that is input to an input terminal of the transmission gate 47, in response to signals input to the first and second terminals.

Figure 19:
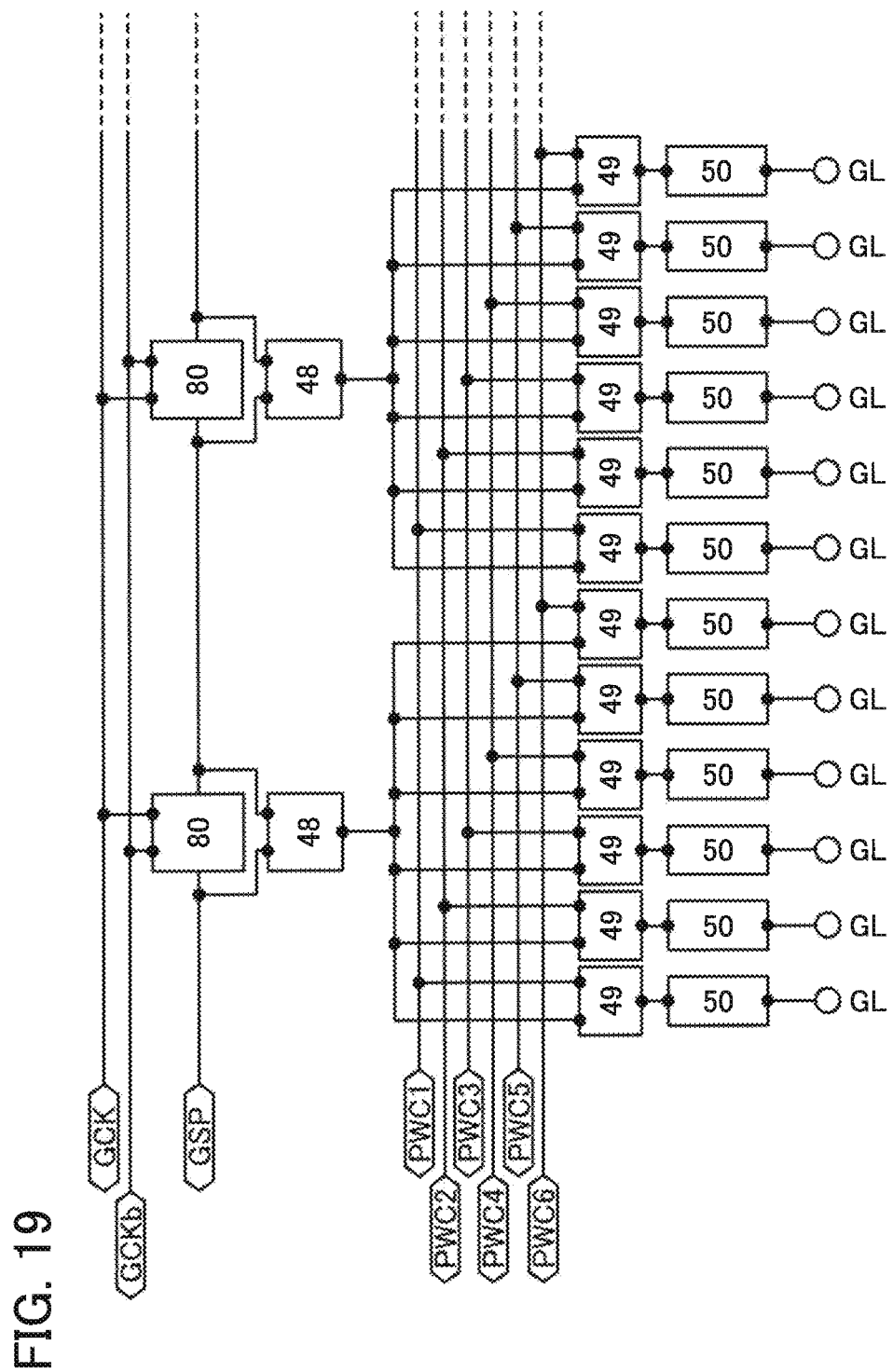
FIG. 19 illustrates a configuration of a scan line driver circuit.

Next, FIG. 19 is a block diagram showing a configuration example of a scan line driver circuit using the sequential circuits 80 in FIGS. 17A and 17B.

In the signal line driver circuit illustrated in FIG. 19, a shift register is formed using a plurality of sequential circuits 80. In each of the plurality of sequential circuits 80, a start pulse signal GSP or a signal of the wiring out connected to the sequential circuit 80 in the previous stage is input to the wiring in. A clock signal GCK is input to one of the wiring c1 and the wiring c2, and a clock signal GCKb, which is obtained by inverting the logic value of the clock signal GCK is input to the other of the wiring c1 and the wiring c2.

A signal input to the wiring in and a signal input to the wiring out of each of the plurality of sequential circuits 80 are input to a pair of input terminals of the corresponding one of a plurality of NANDs 48. A signal output from an output terminal of each of the plurality of NANDs 48 is input to one of a pair of input terminals of the corresponding one of a plurality of NORs 49. A signal PWC is input to the other of the pair of input terminals of each of the plurality of NORs 49. Specifically, FIG. 19 shows an example in which a signal output from the output terminal of one NAND 48 is input to one of the pair of input terminals of each of six NORs 49. Signals PWC1 to PWC6 are input to the other of the pair of input terminals of each of the six NORs 49. Signals output from output terminals of the plurality of NORs 49 are input to the plurality of wirings GL through buffers 50.

Note that any of the transistors 10 illustrated in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be used not only in the sequential circuit 80 but also in a variety of circuits included in the signal line driver circuit in FIG. 18 and a variety of circuits included in the scan line driver circuit in FIG. 19. The on-state current of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D can be large. Therefore, the use of any of the transistors 10 in FIGS. 1A to 1D, FIGS. 2A to 2D, FIGS. 3A to 3D, FIGS. 4A to 4D, FIGS. 5A to 5D, FIGS. 6A to 6D, and FIGS. 7A to 7D for the circuits included in the signal line drive circuit or the scan line driver circuit enables high-speed operation of the signal line driver circuit or the scan line driver circuit. Furthermore, the off-state current of any of the transistors 10 in FIGS. 2A to 2D, FIGS. 4A to 4D, FIGS. 5A to 5D, FIGS. 6A to 6D, and FIGS. 7A to 7D can be small. Therefore, the use of any of the transistors 10 in FIGS. 2A to 2D, FIGS. 4A to 4D, FIGS. 5A to 5D, FIGS. 6A to 6D, and FIGS. 7A to 7D for the circuits included in the signal line driver circuit or the scan line driver circuit can reduce the power consumption of the signal line driver circuit or the scan line driver circuit.

<Exterior Appearance of Light-Emitting Device>

Figure 20:
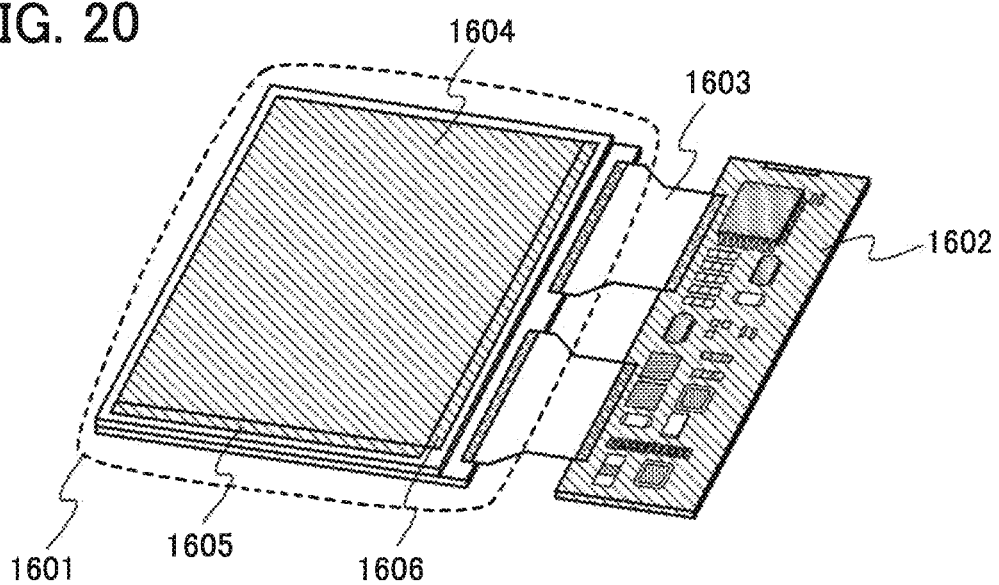
FIG. 20 is a perspective view of a light-emitting device.

FIG. 20 is a perspective view illustrating an example of the exterior appearance of a light-emitting device corresponding to one mode of a semiconductor device of the present invention. The light-emitting device shown in FIG. 20 includes a panel 1601; a circuit board 1602 including a controller, a power circuit, an image processing circuit, an image memory, a CPU, and the like; and a connection portion 1603. The panel 1601 includes a pixel portion 1604 including a plurality of pixels, a driver circuit 1605 that selects a plurality of pixels row by row, and a driver circuit 1606 that controls supply of image signals Sig to the pixels in a selected row.

A variety of signals and power supply potentials are input from the circuit board 1602 to the panel 1601 through the connection portion 1603. As the connecting portion 1603, a flexible printed circuit (FPC) or the like can be used. In the case where a COF tape is used as the connection portion 1603, part of circuits in the circuit board 1602 or part of the driver circuit 1605 or the driver circuit 1606 included in the panel 1601 may be formed on a chip separately prepared, and the chip may be connected to the COF tape by chip on film (COF).

Structure Example of Electronic Appliance

A semiconductor device of one embodiment of the present invention can be used for display devices, laptop computers, or image reproducing devices provided with recording media (typically, devices which reproduce the content of recording media such as digital versatile discs (DVDs) and have displays for displaying the reproduced images). Furthermore, as an electronic appliance which can include the semiconductor device of one embodiment of the present invention, mobile phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 21A to 21F show specific examples of these electronic appliances.

Figure 21A:
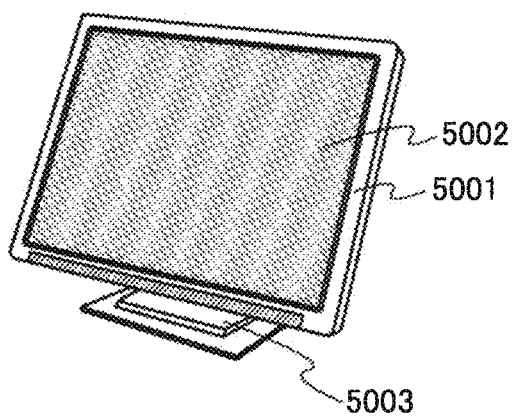
FIGS. 21A to 21F each illustrate an electronic appliance.

FIG. 21A shows a display device including a housing 5001, a display portion 5002, a supporting base 5003, and the like. The semiconductor device of one embodiment of the present invention can be used for the display portion 5002 or a variety of circuits. Note that the category of the display device includes all the display devices for displaying information, such as display devices for a personal computer, TV broadcast reception, advertisement display, and the like.

Figure 21B:
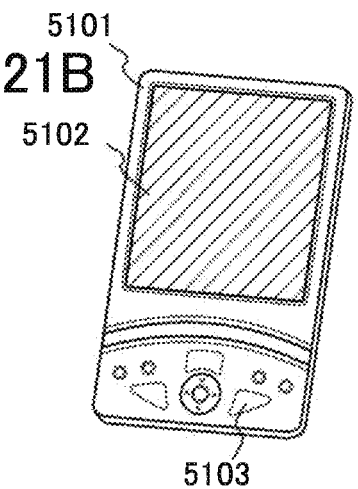

FIG. 21B shows a portable digital assistant including a housing 5101, a display portion 5102, an operation key 5103, and the like. The semiconductor device of one embodiment of the present invention can be used for the display portion 5102 or a variety of circuits.

Figure 21C:
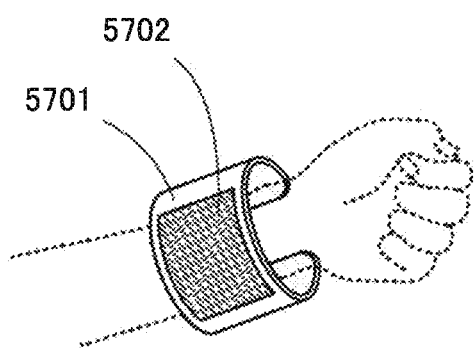

FIG. 21C shows a display device which includes a housing 5701 having a curved surface, a display portion 5702, and the like. The semiconductor device of one embodiment of the present invention can be used for the display portion 5702 or a variety of circuits. When a flexible substrate is used for the semiconductor device of one embodiment of the present invention, it is possible to use the semiconductor device as the display portion 5702 supported by the housing 5701 having a curved surface. Consequently, it is possible to provide a user-friendly display device that is flexible and lightweight.

Figure 21D:
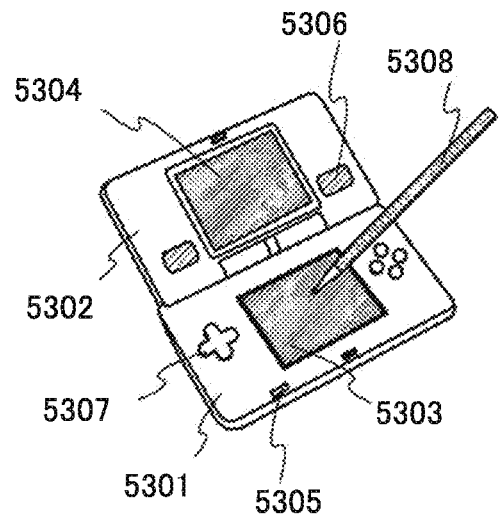

FIG. 21D shows a portable game machine including a housing 5301, a housing 5302, a display portion 5303, a display portion 5304, a microphone 5305, speakers 5306, an operation key 5307, a stylus 5308, and the like. The semiconductor device of one embodiment of the present invention can be used for the display portion 5303, the display portion 5304, or the variety of circuits. Note that although the portable game machine shown in FIG. 21D includes two display portions, the display portions 5303 and 5304, the number of display portions included in the portable game machine is not limited thereto.

Figure 21E:
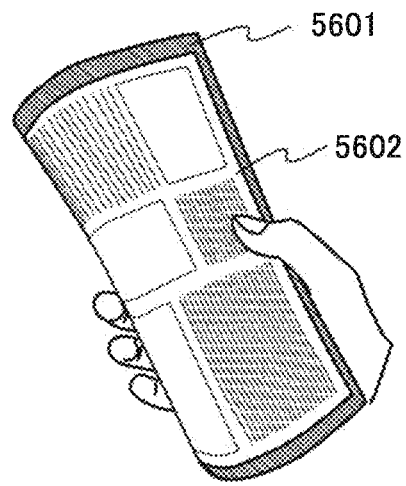

FIG. 21E shows an e-book reader which includes a housing 5601, a display portion 5602, and the like. The semiconductor device of one embodiment of the present invention can be used for the display portion 5602 or a variety of circuits. When a flexible substrate is used, the display portion can have flexibility, so that it is possible to provide a user-friendly e-book reader that is flexible and lightweight.

Figure 21F:
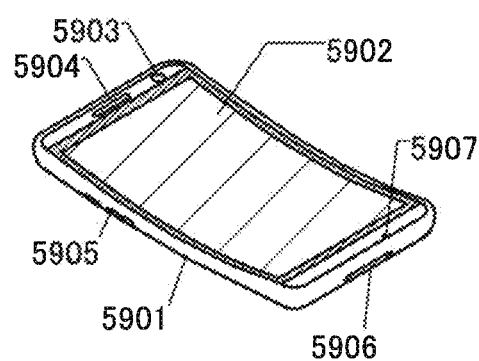

FIG. 21F shows a mobile phone which includes a display portion 5902, a microphone 5907, a speaker 5904, a camera 5903, an external connection port 5906, and an operation button 5905 in a housing 5901. The semiconductor device of one embodiment of the present invention can be used for the display portion 5902 or the variety of circuits. When the semiconductor device of one embodiment of the present invention is provided over a flexible substrate, the semiconductor device can be used as the display portion 5902 having a curved surface, as illustrated in FIG. 21F.

EXPLANATION OF REFERENCE

1: structure example;
2: structure example;
3: structure example;
4: structure example;
5: structure example;
6: structure example;
7: structure example;
10: transistor;
10a: transistor;
10b: transistor;
10c: transistor;
10N: transistor;
10P: transistor;
11: substrate;
12: semiconductor film;
12a: channel formation region;
12b: impurity region;
12c: impurity region;
13: insulating film;
13a: insulating film;
13c: insulating film;
14: conductive film;
15: conductive film;
16: insulating film;
17: conductive film;
17a: conductive film;
17b: conductive film;
17c: conductive film;
18: opening portion;
18a: opening portion;
18b: opening portion;
18c: opening portion;
19: opening portion;
19a: opening portion;
19b: opening portion;
19c: opening portion;
20: conductive film;
21: insulating film;
22: opening portion;
23: opening portion;
24: conductive film;
25: opening portion;
26: conductive film;
27: conductive film;
28: opening portion;
29: opening portion;
30: conductive film;
31: conductive film;
32: conductive film;
33: conductive film;
40: NAND;
42: transistor;
43: light-emitting element;
44: buffer;
45: buffer;
46: inverter;
47: transmission gate;
48: NAND;
50: buffer;
55: pixel;
56: transistor;
57: capacitor;
60: liquid crystal element;
70: semiconductor display device;
71: pixel portion;
72: scan line driver circuit;
73: signal line driver circuit;
74: wiring;
75: wiring;
76: wiring;
77: wiring;
78: wiring;
79: wiring;
80: sequential circuit;
81: transistor;
82: transistor;
83: transistor;
84: transistor;
85: transistor;
86: transistor;
87: transistor;
88: transistor;
89: transistor;
90: transistor;
95: transistor;
96: transistor;
97: capacitor;
98: light-emitting element;
300: substrate;

301: insulating film;
302: conductive film;
303: conductive film;
304: insulating film;
305: semiconductor film;
306: semiconductor film;
307: semiconductor film;
308: insulating film;
309: conductive film;
310: conductive film;
311: resist;
312: impurity region;
313: resist;
314: impurity region;
320: insulating film;
321: conductive film;
322: conductive film;
400: substrate;
404: conductive film;
420: insulating film;
424: conductive film;
425: insulating film;
426: insulating film;
427: EL layer;
428: conductive film;
430: substrate;
431: blocking film;
432: coloring layer;
501: conductive film;
502: semiconductor film;
503: conductive film;
504: conductive film;
505: conductive film;
506: conductive film;
507: semiconductor film;
508: conductive film;
509: conductive film;
510: conductive film;
511: conductive film;
1601: panel;
1602: circuit substrate;
1603: connection portion;
1604: pixel portion;
1605: driver circuit;
1606: driver circuit;
5001: housing;
5002: display portion;
5003: supporting base;
5101: housing;
5102: display portion;
5103: operation key;
5301: housing;
5302: housing;
5303: display portion;
5304: display portion;
5305: microphone;
5306: speaker;
5307: operation key;
5308: stylus;
5601: housing;
5602: display portion;
5701: housing;
5702: display portion;
5901: housing;
5902: display portion;
5903: camera;
5904: speaker;
5905: button;
5906: external connection port;
5907: microphone This application is based on Japanese Patent Application serial no. 2013-190275 filed with Japan Patent Office on Sep. 13, 2013, the entire contents of which are hereby incorporated by reference.

The invention claimed is:

1. A semiconductor device comprising:
a transistor comprising:
a first conductive layer over a substrate;
a first insulating film over the first conductive layer;
a semiconductor film comprising a channel formation region over and in direct contact with the first insulating film, the semiconductor film containing silicon;
a second insulating film over the semiconductor film;
a second conductive layer;
a third conductive layer over the second insulating film; and
a fourth conductive layer over the second insulating film,
wherein a first region of the second conductive layer is over the semiconductor film,
wherein in a cross section in a channel width direction of the transistor, the second conductive layer continuously covers a first side surface, a top surface, and a second side surface of the semiconductor film,
wherein in the cross section in the channel width direction of the transistor, the second insulating film is between the second conductive layer and the first side surface, the top surface, and the second side surface of the semiconductor film,
wherein in a cross section in a channel length direction of the transistor, a width of the second conductive layer is smaller than a distance between the third conductive layer and the fourth conductive layer, and
wherein a second region of the second conductive layer is in direct contact with the first conductive layer through an opening in the first insulating film.

2. The semiconductor device according to claim 1, wherein the semiconductor film further contains germanium.

3. The semiconductor device according to claim 1, wherein the semiconductor film is a polycrystalline semiconductor film.

4. The semiconductor device according to claim 1, wherein in the cross section in the channel length direction of the transistor, a width of the first conductive layer is larger than the width of the second conductive layer.

5. The semiconductor device according to claim 1, wherein in the cross section in the channel width direction of the transistor, an end portion of the second conductive layer overlaps with the first conductive layer.

6. The semiconductor device according to claim 1, wherein the semiconductor film contains boron at a concentration higher than or equal to $1\times10^{16}$ atoms/cm$^3$ and lower than or equal to $5\times10^{17}$ atoms/cm$^3$.

7. The semiconductor device according to claim 1, wherein a ratio of a thickness to a channel width in the channel formation region of the semiconductor film is greater than 1 and less than or equal to 10.

8. The semiconductor device according to claim 1, wherein a bottom surface of the second conductive layer is in direct contact with a top surface of the first conductive layer.

9. The semiconductor device according to claim 1,
wherein the third conductive layer comprises a first region and a second region,
wherein the first region of the third conductive layer overlaps with the semiconductor film, and
wherein the second region of the third conductive layer does not overlap with the semiconductor film.

10. A semiconductor device comprising:
a transistor comprising:
  a first gate electrode over a substrate;
  a first insulating film over the first gate electrode;
  a semiconductor film comprising a channel formation region over and in direct contact with the first insulating film, the semiconductor film containing silicon;
  a source electrode and a drain electrode electrically connected to the semiconductor film; and
  a second gate electrode,
wherein a first region of the second gate electrode is over the semiconductor film,
wherein in a cross section in a channel width direction of the transistor, the second gate electrode continuously covers a first side surface, a top surface, and a second side surface of the semiconductor film,
wherein a second region of the second gate electrode is in direct contact with the first gate electrode through an opening in the first insulating film, and
wherein in a cross section in a channel length direction of the transistor, a width of the second gate electrode is smaller than a distance between the source electrode and the drain electrode.

11. The semiconductor device according to claim 10, further comprising a second insulating film over the semiconductor film,
wherein in the cross section in the channel width direction of the transistor, the second insulating film is between the second gate electrode and the first side surface, the top surface, and the second side surface of the semiconductor film.

12. The semiconductor device according to claim 11,
wherein the source electrode is over the second insulating film,
wherein the source electrode comprises a first region and a second region,
wherein the first region of the source electrode overlaps with the semiconductor film, and
wherein the second region of the source electrode does not overlap with the semiconductor film.

13. The semiconductor device according to claim 10, wherein the semiconductor film further contains germanium.

14. The semiconductor device according to claim 10, wherein the semiconductor film is a polycrystalline semiconductor film.

15. The semiconductor device according to claim 10, wherein in the cross section in the channel length direction of the transistor, a width of the first gate electrode is larger than the width of the second gate electrode.

16. The semiconductor device according to claim 10, wherein in the cross section in the channel width direction of the transistor, an end portion of the second gate electrode overlaps with the first gate electrode.

17. The semiconductor device according to claim 10, wherein the semiconductor film contains boron at a concentration higher than or equal to $1\times10^{16}$ atoms/cm$^3$ and lower than or equal to $5\times10^{17}$ atoms/cm$^3$.

18. The semiconductor device according to claim 10, wherein a ratio of a thickness to a channel width in the channel formation region of the semiconductor film is greater than 1 and less than or equal to 10.

19. The semiconductor device according to claim 10, wherein a bottom surface of the second gate electrode is in direct contact with a top surface of the first gate electrode.

* * * * *